(12) United States Patent
Woo et al.

(10) Patent No.: US 11,264,742 B2
(45) Date of Patent: Mar. 1, 2022

(54) DISPLAY DEVICE

(71) Applicant: Samsung Display Co., Ltd., Yongin-si (KR)

(72) Inventors: Chan Yoon Woo, Cheonan-si (KR); Seung Hwan Cheong, Hwaseong-si (KR); Ah Young Son, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/837,919

(22) Filed: Apr. 1, 2020

(65) Prior Publication Data

US 2021/0066828 A1   Mar. 4, 2021

(30) Foreign Application Priority Data

Sep. 2, 2019  (KR) .................... 10-2019-0108335

(51) Int. Cl.
*H05K 7/00* (2006.01)
*H01R 12/62* (2011.01)
*H05K 1/14* (2006.01)

(52) U.S. Cl.
CPC ............. *H01R 12/62* (2013.01); *H05K 1/144* (2013.01); *H05K 1/147* (2013.01); *H05K 2201/041* (2013.01); *H05K 2201/09027* (2013.01); *H05K 2201/10128* (2013.01); *H05K 2201/10234* (2013.01)

(58) Field of Classification Search
CPC ........ H01R 12/62; H05K 1/144; H05K 1/147; H05K 2201/09027; H05K 2201/10234; H05K 2201/041; H05K 2201/10128
See application file for complete search history.

(56) References Cited

U.S. PATENT DOCUMENTS

| 2010/0220072 | A1* | 9/2010 | Chien | ...................... G06F 3/041 345/173 |
|---|---|---|---|---|
| 2016/0081190 | A1 | 3/2016 | Inagaki et al. | |
| 2016/0181349 | A1* | 6/2016 | Cho | .................... H01L 27/3279 257/40 |
| 2017/0060317 | A1* | 3/2017 | Kim | ...................... G06F 3/0412 |
| 2018/0005948 | A1* | 1/2018 | Jo | .......................... H05K 1/142 |
| 2018/0063962 | A1* | 3/2018 | Lee | ......................... G06F 3/041 |
| 2018/0241859 | A1 | 8/2018 | Cho et al. | |
| 2019/0139784 | A1* | 5/2019 | Lin | ................... H01L 23/49811 |
| 2019/0208642 | A1* | 7/2019 | Eun | ........................ H05K 1/189 |

(Continued)

FOREIGN PATENT DOCUMENTS

KR    10-2018-0095371    8/2018

*Primary Examiner* — Yuriy Semenenko
(74) *Attorney, Agent, or Firm* — H.C. Park & Associates, PLC

(57) ABSTRACT

The display device includes: a display panel; a first circuit board having a first portion connected to one portion of the display panel and comprising a connector; and a second circuit board electrically connected to the first circuit board through the connector, wherein the first portion includes a base film, a dummy pad disposed on the base film, and a first solder mask partially covering the dummy pad and exposing a portion of the dummy pad, the dummy pad includes a covered region covered by the first solder mask and an exposed region exposed by the first solder mask, and a solder ball, The exposed region of the dummy pad is connected to the connector through a solder ball.

20 Claims, 16 Drawing Sheets

(56) References Cited

U.S. PATENT DOCUMENTS

2019/0333834 A1* 10/2019 Sung ................. H01L 25/03
2020/0091123 A1*  3/2020 Sung ............. H01L 23/49827
2020/0203300 A1*  6/2020 Huang ............... H01L 24/17

* cited by examiner

DISPLAY DEVICE

CROSS REFERENCE TO RELATED APPLICATION

This application claims priority from and the benefit of Korean Patent Application No. 10-2019-0108335, filed on Sep. 2, 2019, which is hereby incorporated by reference for all purposes as if fully set forth herein.

BACKGROUND

Field

Exemplary implementations of the invention relate generally to a display device and, more specially, to a display device having a circuit board connector that minimizes failures due to tilting or shifting of the connector.

Discussion of the Background

With development of information technologies, the demand for display devices to display images has increased in various forms. For example, a display device is applied to various electronic devices such as a smartphone, a digital camera, a laptop, a navigation system, and a smart television. The display device may be a flat panel display device such as a liquid crystal display device, a field emission display device, an organic light emitting display device, or the like. Among such flat panel display devices, the organic light emitting display device includes a light emitting element that allows each pixel of a display panel to emit light by itself such that the organic light emitting display device is able to display an image even without a backlight unit that provides light to the display panel.

Each pixel of the organic light emitting display device may include the light emitting element, a driving transistor configured to adjust the amount of driving current supplied from a power line to the light emitting element according to a voltage of a gate electrode, and an emission control transistor configured to control connection between the driving transistor and the light emitting element.

The above information disclosed in this Background section is only for understanding of the background of the inventive concepts, and, therefore, it may contain information that does not constitute prior art.

SUMMARY

Applicant discovered that tilting and shifting of the circuit board connector in a display device can produce electrical and/or mechanical failures.

Display devices having circuit boards with connectors constructed according to the principles and exemplary implementations of the invention are capable of reducing tilting and shifting of the connector, thereby reducing or preventing damage, such as electrical and/or mechanical disconnection.

Additional features of the inventive concepts will be set forth in the description which follows, and in part will be apparent from the description, or may be learned by practice of the inventive concepts.

According to an aspect of the invention, a display device includes: a display panel; a first circuit board having a first portion connected to one portion of the display panel and comprising a connector; and a second circuit board electrically connected to the first circuit board through the connector, wherein the first portion includes a base film, a dummy pad disposed on the base film, and a first solder mask partially covering the dummy pad and exposing a portion of the dummy pad, the dummy pad includes a covered region covered by the first solder mask and an exposed region exposed by the first solder mask, and a solder ball. The exposed region of the dummy pad is connected to the connector through a solder ball.

The dummy pad and the solder ball may include a plurality of dummy pads and a plurality of solder balls, respectively, the plurality of dummy pads and solder balls may be spaced apart from each other, respectively, and the first solder mask may be disposed on inner portions of the dummy pads between the solder balls.

The connector may include a base substrate and a plurality of dummy connection pads disposed on the base substrate, each of the dummy connection pads overlapping one of the plurality of dummy pads, and the plurality of dummy connection pads may be spaced apart from each other.

The connector may further include a second solder mask partially covering the dummy connection pad and exposing a portion of the dummy connection pad, the portion of the dummy connection pad exposed by the second solder mask being connected to one of the dummy pad through the solder balls, the first solder mask and the second solder mask overlapping each other.

The first portion may include a connection part having a data pad disposed on the base film, the data pad may include a plurality of data pads, the plurality of data pads may be arranged in one direction, and the first solder mask may surround the plurality of data pads.

The first solder mask and the data pad arrangement may be spaced apart from each other with an open portion therebetween.

The connection part may further include a dummy line surrounding and being connected to the plurality of dummy pads, and the dummy line may be electrically connected to a ground line layer of the circuit board.

The dummy line and the dummy pad may be disposed in the same layer.

The dummy line may overlap the first solder mask.

The dummy line may directly contact the first solder mask.

The connection part may further include a data line electrically connected to the data pad.

The first solder mask may be further disposed on outer portions of the dummy pads, and the at least one of the solder balls may directly contact the first solder mask on the outer portions of the dummy pads.

The first solder mask may be further disposed on the outer portions of the dummy pads, the at least one of the solder balls may be spaced apart from the first solder mask on the outer portions of the dummy pads, by a separation distance of about 0.06 mm or less.

The first circuit board may include a display circuit board having at least one component to drive the display panel, and the second circuit board may include a main circuit having at least component to control the display device.

According to another aspect of the invention, a display device includes: a display panel; a first circuit board having a first portion connected to one portion of the display panel and comprising a connector; and a second circuit board electrically connected to the first circuit board through the connector, wherein the first portion includes a base film, a dummy pad disposed on the base film, and a first solder mask completely exposing the dummy pad, an exposed region of the dummy pad is connected to the connector through a solder ball, the connector includes a base substrate and a dummy connection pad which is disposed on the base substrate and corresponds to the dummy pad, the exposed region of the dummy pad extends further outwardly than the dummy connection pad, and the portion of the exposed region of the dummy pad extending further outwardly than the dummy connection pad by a first distance, an outer portion of the dummy pad being spaced from the first solder mask adjacent to the outer portion of the dummy pad by a second distance, the first distance being less than twice the second distance.

The first distance may be 0.06 mm or less.

The dummy pad and the solder ball may include a plurality of dummy pads and a plurality of solder balls, respectively, the plurality of dummy pads and solder balls may be spaced apart from each other, respectively, and the first solder mask may be further disposed on inner portions of the dummy pads between the solder balls.

The connector may further include a second solder mask exposing the dummy connection pad, and the dummy connection pad may be connected to the dummy pad through the solder ball, the first solder mask and the second solder mask may overlap each other.

The first portion may include a connection part having a dummy line surrounding the plurality of dummy pads and being connected to the plurality of dummy pads, and the dummy line may be electrically connected to a ground line layer of the first circuit board.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
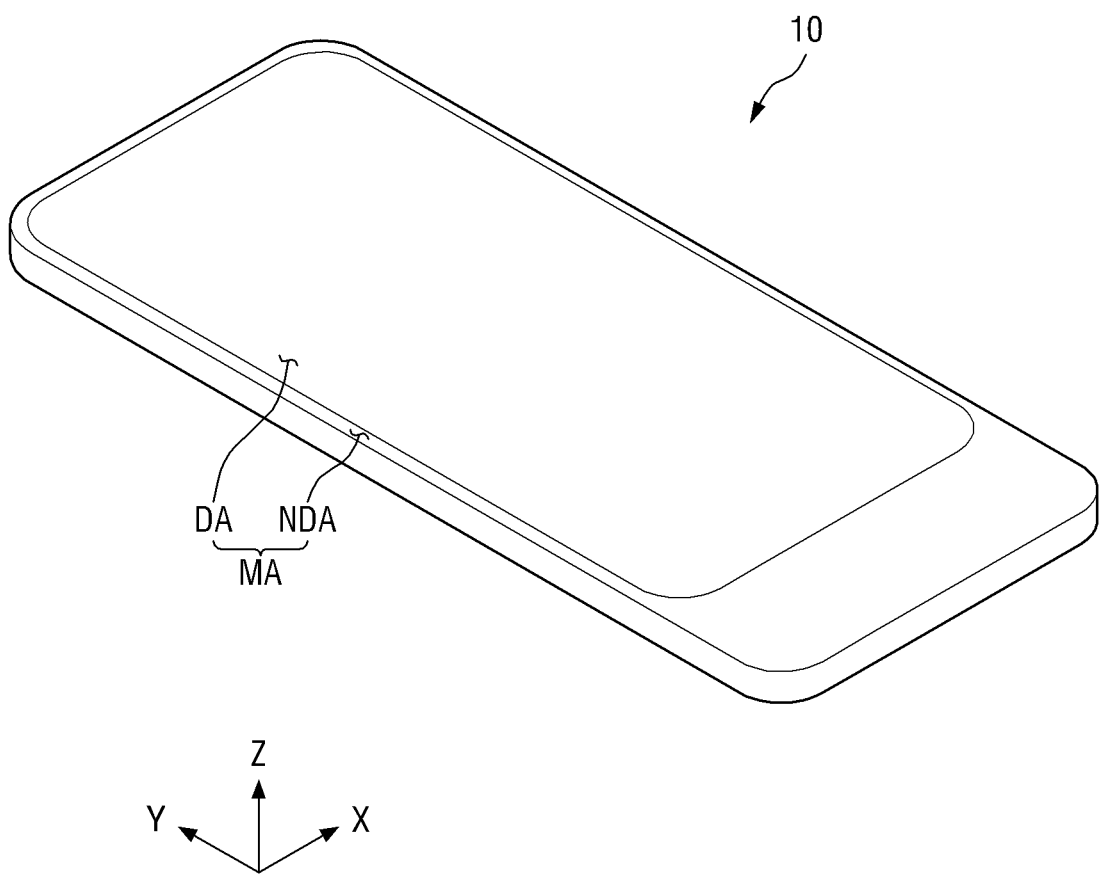
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
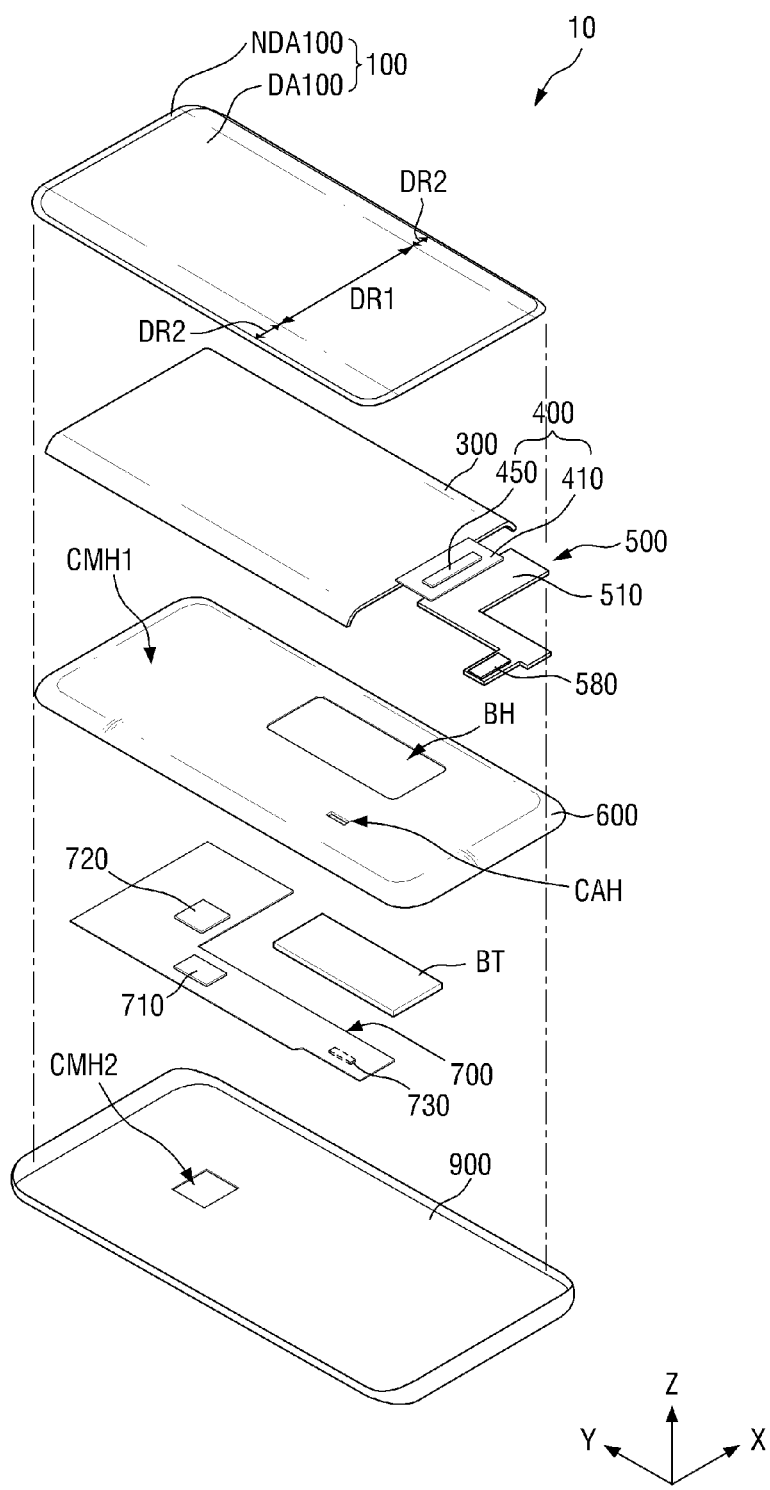
FIG. 2 is an exploded perspective view of the display of FIG. 1.
Figure 3:
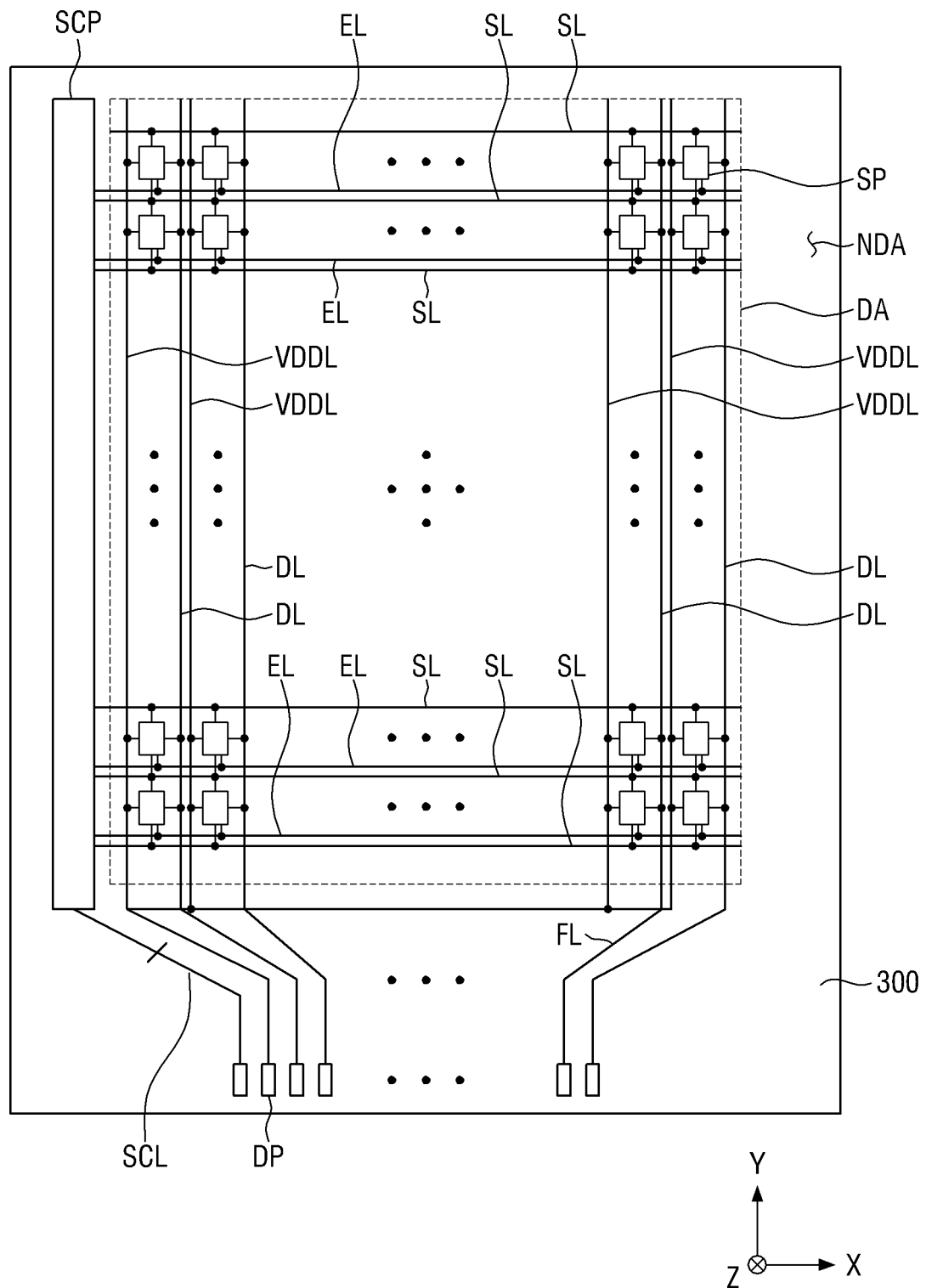
FIG. 3 is a block diagram of an exemplary embodiment of the display panel of FIG. 1.
Figure 4:
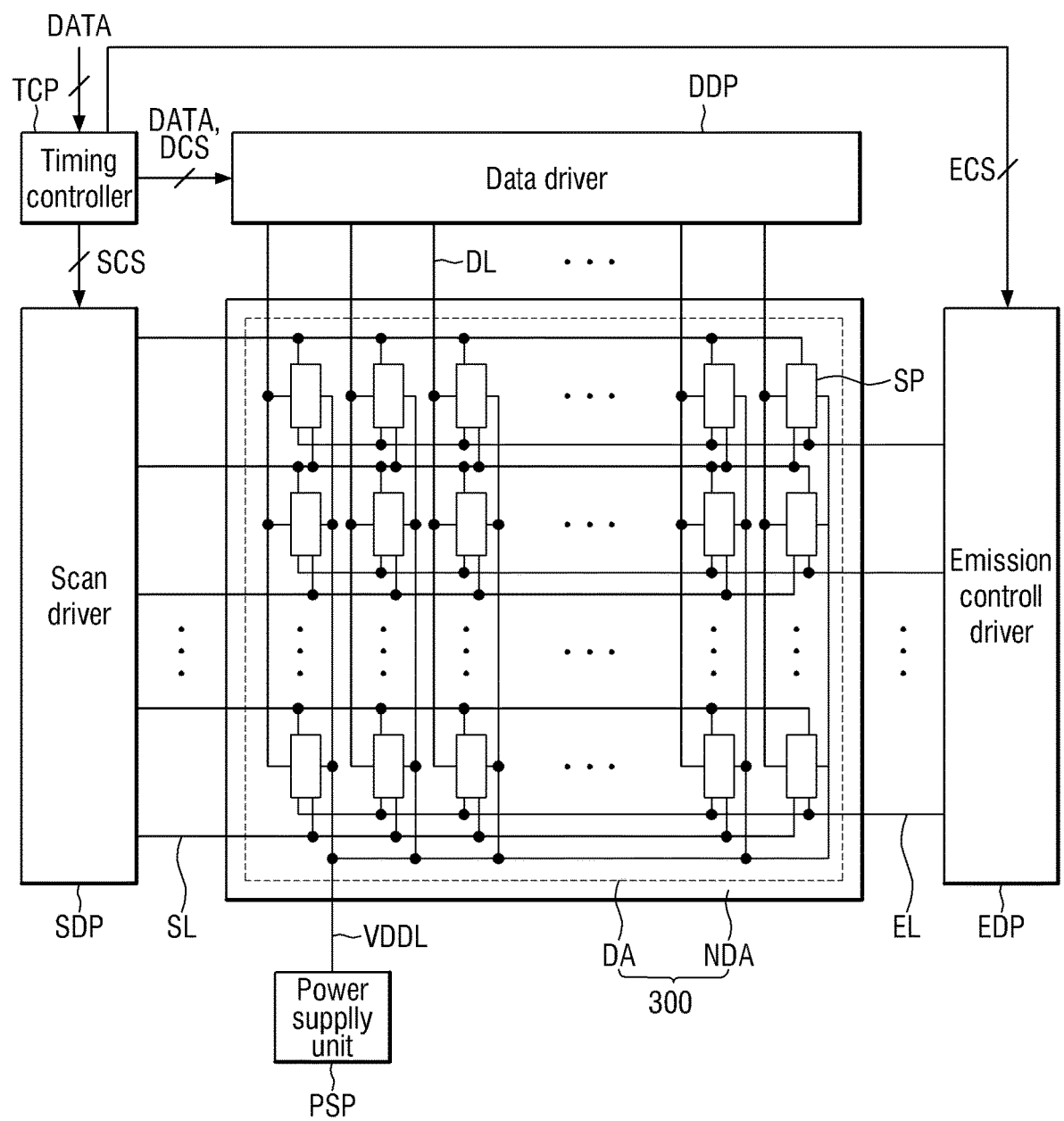
FIG. 4 is a block diagram of another exemplary embodiment of the display of FIG. 1.

FIG. 1 is a perspective view of an exemplary embodiment of a display device constructed according to the principles of the invention, FIG. 2 is an exploded perspective view of the display device of FIG. 1, FIG. 3 is a block diagram of an exemplary embodiment of the display panel of FIG. 1 and FIG. 4 is a block diagram of another exemplary embodiment of the display of FIG. 1.

In the this specification, "upper portion," "top," and "upper surface" indicate an upper direction, i.e., a Z-axis direction, with respect to a display panel 300, and "lower portion," "bottom," and "lower surface" indicate a lower direction, i.e., the direction opposite to the Z-axis direction, with respect to the display panel 300. Also, "left," "right," "above," and "under" indicate directions when the display panel 300 is viewed in a plan view. For example, "left" indicates a direction opposite to an X-axis direction, "right" indicates the X-axis direction, "above" indicates a Y-axis direction," and "under" indicates the direction opposite to the Y-axis direction.

Referring to FIGS. 1 to 4, a display device 10 is a device for displaying a video or a still image and may be used as a display screen of various products such as a television, a laptop, a monitor, a billboard, the Internet of Things (IoT), as well as portable electronic devices such as a mobile phone, a smartphone, a tablet personal computer (PC), a smartwatch, a watch phone, a mobile communication terminal, an electronic organizer, an electronic book, a portable multimedia player (PMP), a navigation, an ultra-mobile PC (UMPC) and the like.

The display device 10 may be a light emitting display device such as an organic light emitting display device that uses an organic light emitting diode (OLED), a quantum dot light emitting display device that includes a quantum dot emissive layer, an inorganic light emitting display device that includes an inorganic semiconductor, a micro light emitting display device that uses a micro LED, or any other known display device. Hereinafter, the display device 10 is described an organic light emitting display device for convenience, but the exemplary embodiments are not limited thereto.

Referring to FIG. 2, the display device 10 may include a cover window 100, the display panel 300, a flexible circuit film 400 or a second substrate, a circuit board 500 or a first substrate, a bracket 600, a main circuit board 700, and a lower cover 900.

The cover window 100 may be disposed above the display panel 300 to cover an upper surface of the display panel 300. Thus, the cover window 100 may serve to protect the upper surface of the display panel 300.

The cover window 100 may include a light transmitting part DA100 corresponding to the display panel 300 and a light blocking part NDA100 corresponding to a excluding the display panel 300. The cover window 100 may be disposed in a first region DR1 and second regions DR2. The light transmitting part DA100 may be disposed in a portion of the first region DR1 and portions of the second regions DR2. The light blocking part NDA100 may be formed to be opaque. Alternatively, the light blocking part NDA100 may be formed as a decorative layer on which patterns are formed that may be shown to a user when an image is not displayed.

The display panel 300 may be disposed under the cover window 100. The display panel 300 may overlap the light transmitting part DA100 of the cover window 100. The display panel 300 may be disposed in the first region DR1 and the second regions DR2. Thus, an image displayed on the display panel 300 may be visible in the second regions DR2 as well as the first region DR1.

The display panel 300 may be a light emitting display panel including a light emitting element. For example, the display panel 300 may be an organic light emitting display panel that uses an OLED, a micro LED display panel that uses a micro LED, a quantum dot light emitting display panel that uses a quantum dot LED including a quantum dot emissive layer, or an inorganic light emitting display panel that uses an inorganic light emitting element including an inorganic semiconductor. Hereinafter, the display panel 300 is described as an organic light emitting display panel for convenience.

The flexible circuit film 400 and the circuit board 500 may be attached to a portion of the display panel 300, such as one of the shorter ends. The flexible circuit film 400 may include a base film 410 and a driving circuit 450 disposed on the base film 410.

One end portion of the flexible circuit film 400 may be attached onto pads DP, which are provided at the one side of the display panel 300, using an anisotropic conductive film. The flexible circuit film 400 may be a flexible printed circuit board (FPCB) which is bendable, a rigid printed circuit board (RPCB) which is rigid and thus not easily bent, or a composite printed circuit board including both the RPCB and the PCB.

The driving circuit 450 and a power supply part 570 for supplying driving voltages for driving the display panel 300 may be disposed on the circuit board 500. The circuit board 500 may further include a connector 580, which may be bendable or in the form of a flexible cable, electrically connected to a main connector 730 of the main circuit board 700 through a cable hole CAH which will be described below.

The bracket 600 may be disposed under the display panel 300 to support components of the display device, such as the panel 300. The bracket 600 may include plastic, metal, or both plastic and metal. A first camera hole CMH1 into which a camera device 720 is inserted, a battery hole BH in which a battery 790 is disposed, and the cable hole CAH through which the connector 580 attached to the circuit board 500 passes may be formed in the bracket 600.

The main circuit board 700 for the display device and the battery 790 may be disposed under the bracket 600. The main circuit board 700 may be a PCB or an FPCB.

The main circuit board 700 may include a main processor 710, the camera device 720, and the main connector 730. The main processor 710 may be formed of an integrated circuit (IC).

The camera device 720 may be disposed at both an upper surface and a lower surface of the main circuit board 700, the main processor 710 may be disposed at the upper surface of the main circuit board 700, and the main connector 730 may be disposed at the lower surface of the main circuit board 700.

The main processor 710 may control all functions of the display device 10. For example, the main processor 710 may output digital video data to the flexible circuit film 400 through the circuit board 500 so that the display panel 300 displays an image.

The main processor 710 may be an application processor, a central processing unit, or a system chip which is formed as an IC.

The camera device 720 processes an image frame such as a still image or a video obtained by an image sensor in a camera mode and outputs the processed image frame to the main processor 710.

The connector 580 which has passed through the cable hole CAH of the bracket 600 may be connected to the main connector 730. Thus, the main circuit board 700 may be electrically connected to the circuit board 500.

The battery 790 may be disposed so as not to overlap the main circuit board 700 in a third direction (Z-axis direction). The battery 790 may overlap the battery hole BH of the bracket 600.

The lower cover 900 may be disposed at lower portions of the main circuit board 700 and the battery 790. The lower cover 900 may be fastened to the bracket 600 and fixed. The lower cover 900 may form an exterior of the lower surface of the display device 10. The lower cover 900 may include plastic, metal, or both plastic and metal.

A second camera hole CMH2 through which a lower surface of the camera device 720 is exposed may be formed in the lower cover 900. The position of the camera device 720 and the positions of the first and second camera holes CMH1 and CMH2 corresponding to the camera device 720 are not limited to the exemplary embodiment illustrated in FIG. 2.

The display panel 300 may be formed in a generally rectangular shape comprising a short side in a first direction (X-axis direction) and a long side in a second direction (Y-axis direction), which intersects the first direction (X-axis direction), in a plan view. A corner where the short side in the first direction (X-axis direction) and the long side in the second direction (Y-axis direction) meet may be formed to be rounded with a predetermined curvature or formed at a right angle. The shape of the display panel 300 in the plan view is not limited to a quadrilateral shape, and the display panel 300 may be formed in another shape such as polygona, circular, or elliptical. The display panel 300 may be formed to be substantially flat, but the exemplary embodiments are not limited thereto, and the display panel 300 may include a curved portion which is formed at left and right side ends and has a fixed curvature or a varying curvature. In addition, the display panel 300 may be formed to be flexible so that it is bendable, foldable, or rollable, as is known in the art.

Referring to FIG. 3, the display panel 300 may include a display area DA in which subpixels SP are formed and an image is displayed and a non-display area NDA which may completely or partially surround the display area DA. In addition to the subpixels SP, scan lines SL, emission lines EL, data lines DL, and first driving voltage lines VDDL which are connected to the subpixels SP may be disposed in the display area DA. The scan lines SL and the emission lines EL may be formed generally parallel in the first direction (X-axis direction), and the data lines DL may be formed generally parallel in the second direction (Y-axis direction) which intersects the first direction (X-axis direction). The first driving voltage lines VDDL may be formed generally parallel in the second direction (Y-axis direction) in the display area DA. The first driving voltage lines VDDL formed generally parallel in the second direction (Y-axis direction) in the display area DA may be connected to each other in the non-display area NDA.

Each subpixel SP may be connected to at least any one of the scan lines SL, any one of the data lines DL, at least one of the emission lines EL, and the first driving voltage line VDDL. A case in which each subpixel SP is connected to two scan lines SL, a single data line DL, a single emission line EL, and the first driving voltage line VDDL is illustrated in FIG. 2, but the exemplary embodiments are not limited thereto. For example, each subpixel SP may also be connected to three scan lines SL instead of two scan lines SL.

Each subpixel SP may include a driving transistor, at least one transistor, a light emitting element, and a capacitor. The transistor is turned on when a scan signal is applied from the scan line SL. Thus, a data voltage of the data line DL may be applied to a gate electrode of a driving transistor DT. The driving transistor DT may emit light by supplying a driving current to the light emitting element according to the data voltage applied to the gate electrode. The driving transistor DT and at least one switching transistor may be a thin film switching transistor. The light emitting element may emit light according to the driving current of the driving transistor DT. The light emitting element may be an OLED including a first electrode, an organic light emitting layer, and a second electrode. The capacitor may serve to maintain the data voltage applied to the gate electrode of the driving transistor DT constant.

The non-display area NDA may be defined as an area from an outer side of the display area DA to an edge of the display panel 300. A scan driver SCP for applying scan signals to the scan lines SL, fan outlines FL between the data lines DL and the flexible circuit film 400, and the pads DP connected to the flexible circuit film 400 shown in FIG. 2 may be disposed in the non-display area NDA. The flexible circuit film 400 and the pads DP may be disposed at one side edge of the display panel 300. The pads DP may be more adjacent to the one side edge of the display panel 300 than the flexible circuit film 400.

The scan driver SCP may be connected to the flexible circuit film 400 through a plurality of scan control lines SCL. The scan driver SCP may receive a scan control signal SCS and an emission control signal ECS from the flexible circuit film 400 through the plurality of scan control lines SCL.

The scan driver SCP may include a scan signal driver SDP and an emission control driver EDP as shown in FIG. 4.

Referring to FIG. 4, the scan signal driver SDP may generate scan signals according to the scan control signal SCS and may sequentially output the scan signals to the scan lines SL. The emission control driver EDP may generate emission control signals according to the emission control signal ECS and may sequentially output the emission control signals to the emission lines EL.

The scan driver SCP may include a plurality of thin film transistors. The scan driver SCP may be formed in the same layer as the thin film transistors of the subpixels SP. The case in which the scan driver SCP is formed at one side of the display area DA, e.g., in the non-display area NDA at the left side, is illustrated in FIG. 3, but the exemplary embodiments are not limited thereto. For example, the scan driver SCP may be formed at both sides of the display area DA, e.g., the non-display areas NDA at the left and right sides.

The flexible circuit film 400 shown in FIG. 2 may include a timing control part TCP, a data driver DDP, and a power supply unit PSP.

The timing control part TCP receives digital video data DATA and timing signals from the circuit board 500 shown in FIG. 2. The timing control part TCP may generate a scan control signal SCS for controlling an operation timing of the scan signal driver SDP according to the timing signals, generate an emission control signal ECS for controlling an operation timing of the emission control driver EDP, and generate a data control signal DCS for controlling an operation timing of the data driver DDP. The timing control part TCP may output the scan control signal SCS to the scan signal driver SDP through a plurality of scan control lines SCL and output the emission control signal ECS to the emission control driver EDP. The timing control part TCP may output the digital video data DATA and the data control signal DCS to the data driver DDP.

The data driver DDP converts the digital video data DATA to positive or negative analog data voltages and outputs the positive or negative analog data voltages to the data lines DL through the fan outlines FL shown in FIG. 3. The subpixels SP are selected by the scan signals of the scan driver SCP, and the data voltages are supplied to the selected subpixels SP.

The power supply unit PSP may generate a first driving voltage and supply the first driving voltage to the first driving voltage line VDDL. Also, the power supply unit PSP may generate a second driving voltage and supply the second driving voltage to a cathode of the OLED of each subpixel SP. The first driving voltage may be a high-potential voltage for driving the OLED, and the second driving voltage may be a low-potential voltage for driving the OLED. That is, the first driving voltage may have a higher potential than the second driving voltage.

Referring to FIG. 2, the flexible circuit film 400 may include the base film 410 and the driving circuit 450 disposed on the base film 410. That is, the driving circuit 450 may be formed as an IC and mounted on the base film 410 of the flexible circuit film 400 using a chip-on-film (COF) method. However, the exemplary embodiments are not limited thereto, and the driving circuit 450 may be disposed on the display panel 300 using a chip-on-glass (COG) method, a chip-on-plastic (COP) method, or an ultrasonic bonding method.

The flexible circuit film 400 may be attached onto the pads DP using an anisotropic conductive film.

Figure 5:
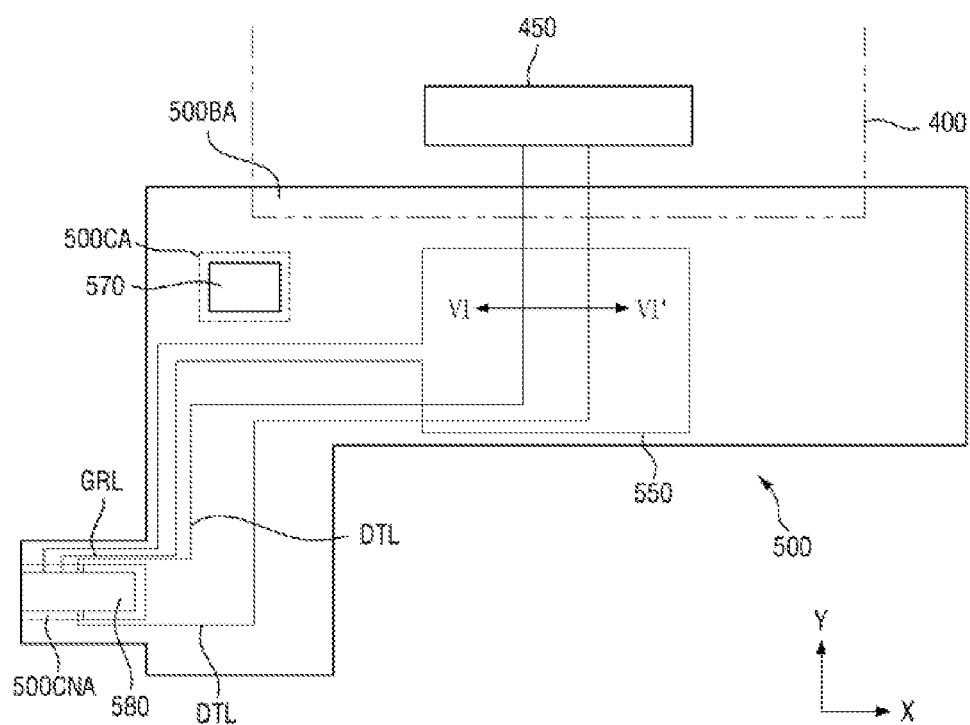
FIG. 5 is a plan layout of an exemplary embodiment of a circuit board of the display device of FIG. 1.
Figure 6:
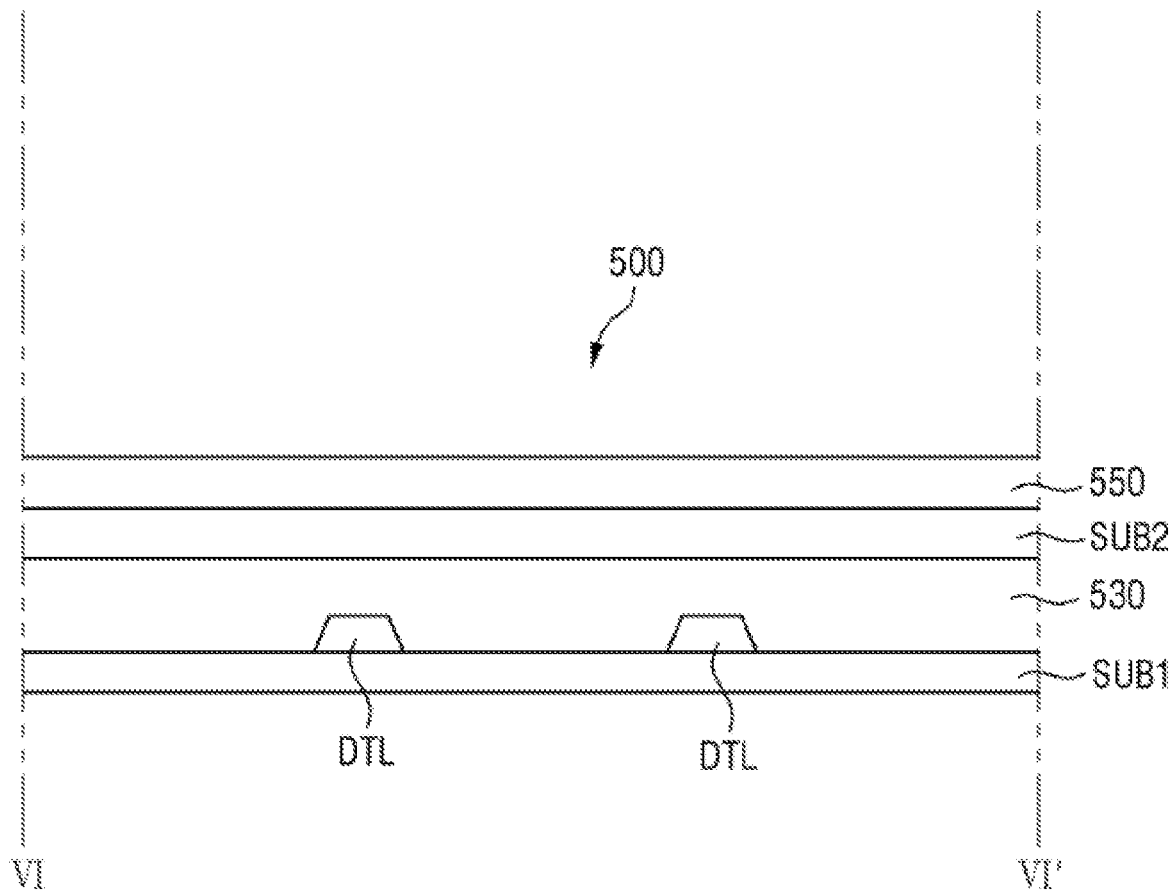
FIG. 6 is a cross-sectional view taken along line VI-VI' of FIG. 5.

FIG. 5 is a plan layout of an exemplary embodiment of a circuit board of the display device of FIG. 1, and FIG. 6 is a cross-sectional view taken along line VI-VI' of FIG. 5.

Referring to FIGS. 5 and 6, the circuit board 500 may include a bent area 500BA attached to the flexible circuit film 400, a component area 500CA in which a plurality of components of the circuit board 500, such as the power supply part 570, are disposed, and a connection area 500CNA or a connection part in which the connector 580 is disposed.

The connector 580 may be disposed in the connection area 500CNA. The connector 580 may be electrically connected to a ground line layer 550 of the circuit board 500 through a dummy line GRL and may be electrically connected to the driving circuit 450 of the flexible circuit film 400 through a data line DTL.

Referring to FIG. 6, the circuit board 500 may include a plurality of stacked structures. The circuit board 500 may include a first base substrate SUB1, a first line layer including a plurality of data lines DTL disposed on the first base substrate SUB1, a second base substrate SUB2, and the ground line layer 550 disposed on the second base substrate SUB2. Further, an insulation layer 530 may be disposed between the first base substrate SUB1 and the second base substrate SUB2.

Each of the base substrates SUB1 and SUB2 may serve to support the first line layer and the ground line layer 550. The base substrates SUB1 and SUB2 may include a flexible material, but the exemplary embodiments are not limited thereto.

The circuit board 500 may further include another ground line layer which is spaced apart from the first line layer with the first base substrate SUB1 disposed therebetween.

The data line DTL may serve to electrically connect the driving circuit 450 to the main processor 710 of the main circuit board 700. The data line DTL may be an image data signal generated by the main processor 710. The data lines DTL adjacent to each other may have signals which have substantially the same magnitude but have opposite signs. Thus, even when noise is generated, the data lines DTL may serve to offset the noise.

The ground line layer 550 may be disposed at a central portion of the circuit board 500. In an area in which the data line DTL overlaps the ground line layer 550, the data line DTL may extend in the second direction (Y-axis direction).

The ground line layer 550 may serve to prevent the first line layer from being electrically affected by another line layer. For example, a power line or the like extending from the power supply part 570 may be further disposed on the first line layer. In this case, the ground line layer 550 may serve to minimize the electrical influence of the power line and the first line layer on each other.

The ground line layer 550 may include a blocking metal. Examples of the blocking metal include copper (Cu), but the exemplary embodiments are not limited thereto. The ground line layer 550 may be applied in the form of a bundle line.

Figure 7:
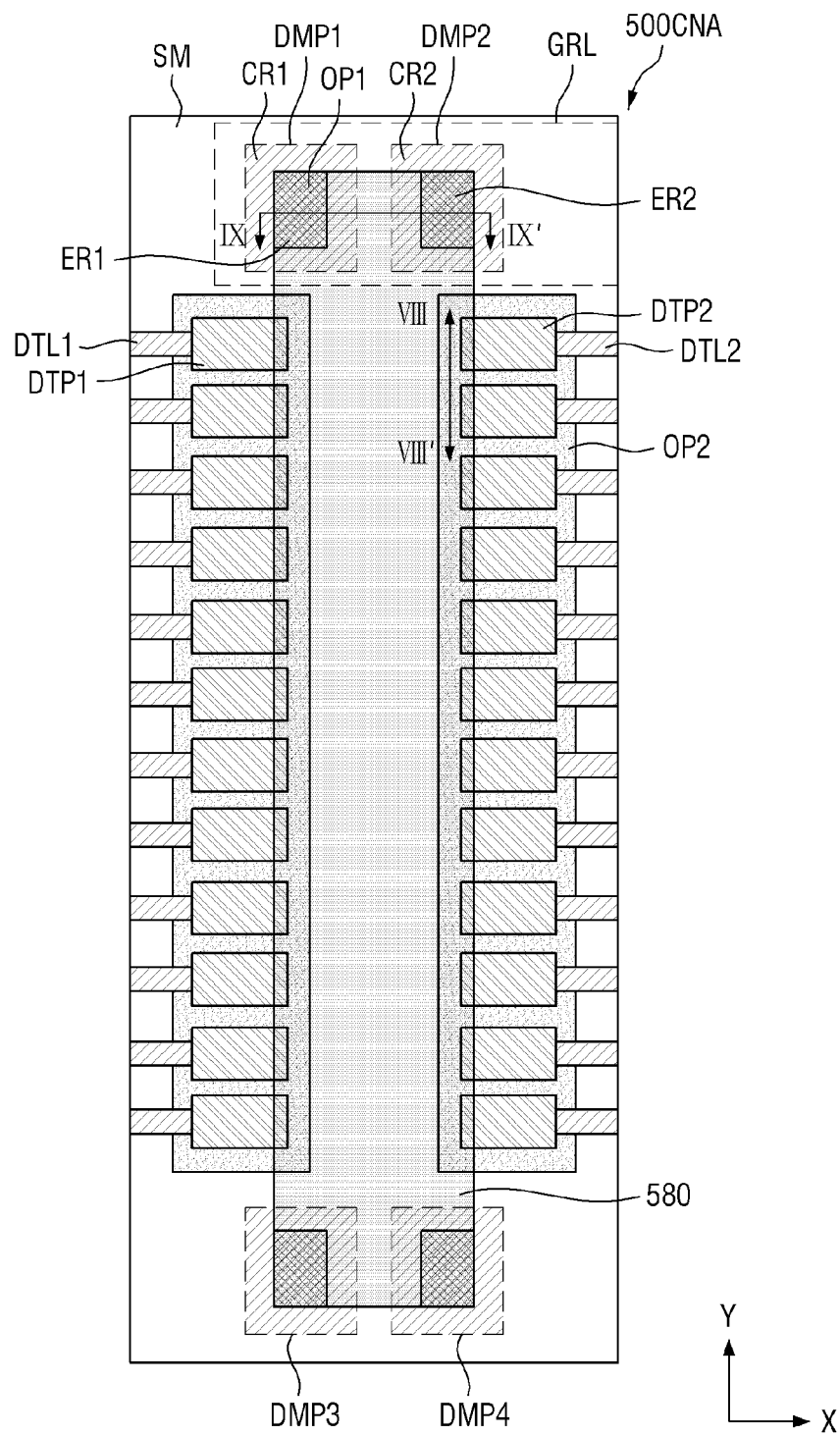
FIG. 7 is an enlarged plan view of an exemplary embodiment of a connection part and a connector of the circuit board of FIG. 5.
Figure 8:
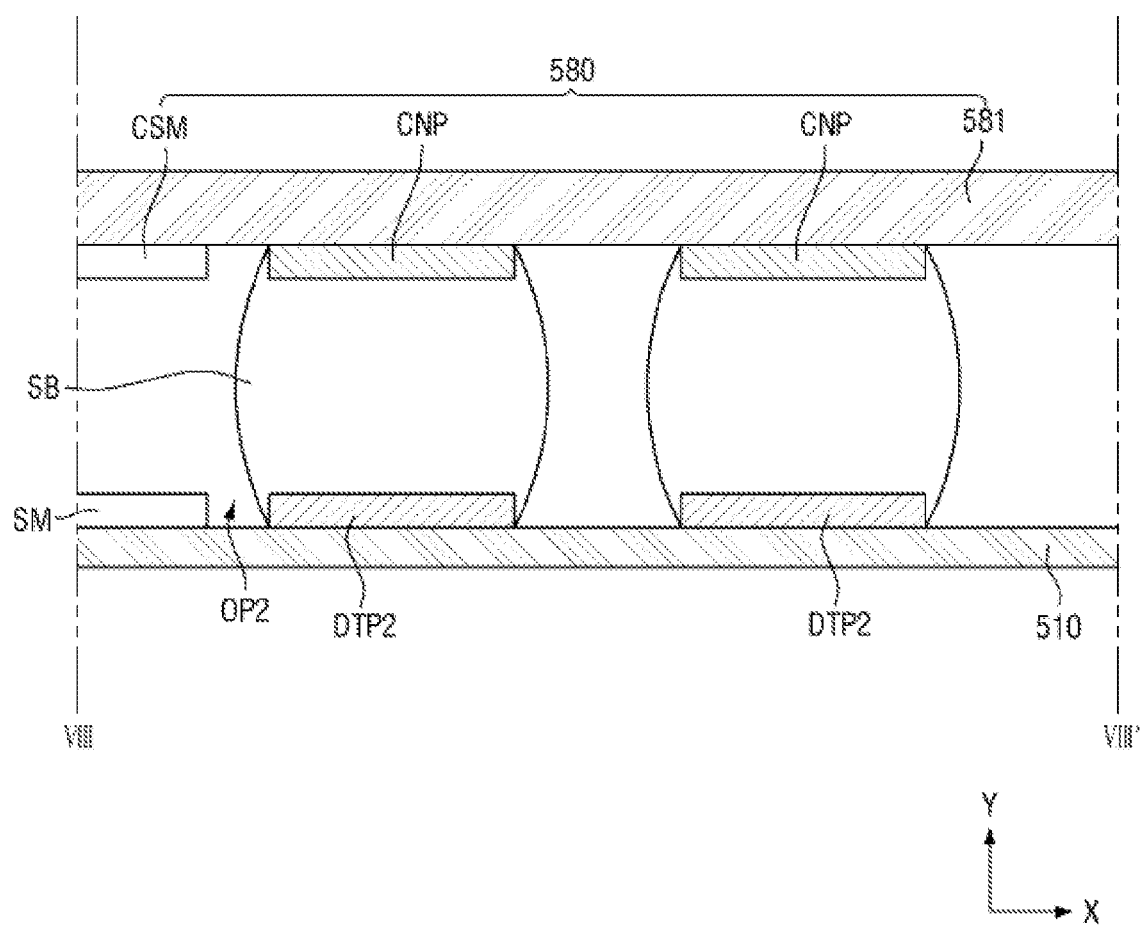
FIG. 8 is a cross-sectional view taken along line VIII-VIII' of FIG. 7.
Figure 9:
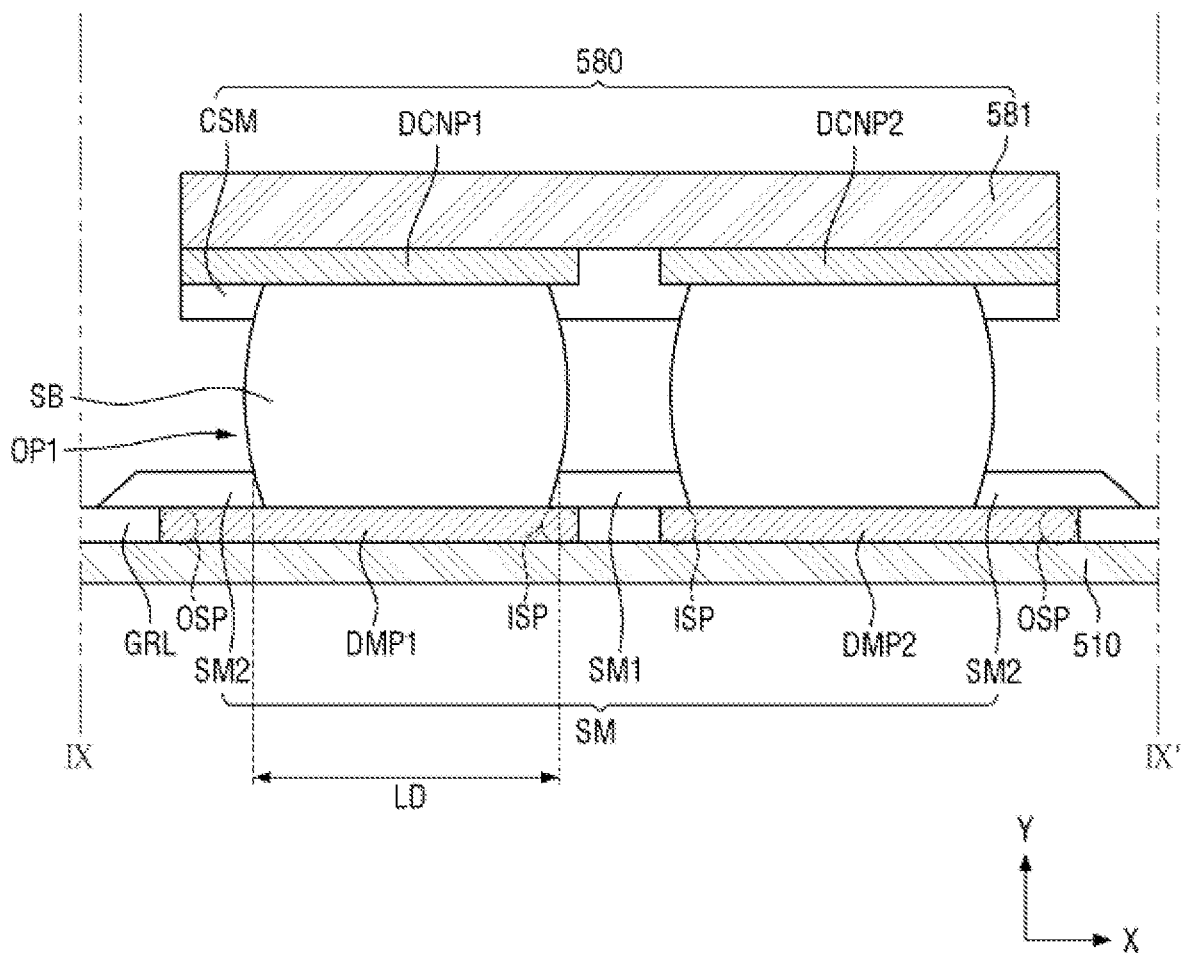
FIG. 9 is a cross-sectional view taken along line IX-IX' of FIG. 7.

FIG. 7 is an enlarged plan view of an exemplary embodiment of a connection part and a connector of the circuit board of FIG. 5, FIG. 8 is a cross-sectional view taken along line VIII-VIII' of FIG. 7, and FIG. 9 is a cross-sectional view taken along line IX-IX' of FIG. 7.

Referring to FIGS. 7 to 9, the connection part 500CNA of the circuit board 500 may have a generally rectangular shape in a plan view. The connection part 500CNA may include long side edges extending in the second direction (Y-axis direction) and short side edges extending in the first direction (X-axis direction). The connection part 500CNA of the circuit board 500 may include a plurality of pads DMP1, DMP2, DMP3, DMP4, DTP1, and DTP2. The dummy pads DMP1 to DMP4 may be disposed adjacent to the short side edges of the connection part 500CNA, and the data pads DTP1 and DTP2 may be disposed adjacent to the long side edges of the connection part 500CNA.

The first and second dummy pads DMP1 and DMP2 may be disposed adjacent to a short side edge at an upper side of the connection part 500CNA, the third and fourth dummy pads DMP3 and DMP4 may be disposed adjacent to a short side edge at a lower side of the connection part 500CNA, the first data pad DTP1 may be disposed adjacent to a long side edge at a right side of the connection part 500CNA, and the second data pad DTP2 may be disposed adjacent to a long side edge at a left side of the connection part 500CNA. The data pads DTP1 and DTP2 may be provided as a plurality of data pads DTP1 and a plurality of data pads DTP2. The plurality of data pads DTP1 and the plurality of data pads DTP2 may be arranged in the second direction (Y-axis direction). That is, the connection part 500CNA may arrangements of first and second data pads.

The first and second dummy pads DMP1 and DMP2 may be spaced apart from each other in the first direction (X-axis direction), and the third and fourth dummy pads DMP3 and DMP4 may be spaced apart from each other in the first direction (X-axis direction).

The connection part 500CNA may further include a plurality of lines GRL, DTL1, and DTL2. The dummy line GRL may be electrically connected to the first and second dummy pads DMP1 and DMP2, and the first and second data lines DTL1 and DTL2 may be electrically connected to the first data pad DTP1 and the second data pad DTP2, respectively.

The dummy line GRL may be disposed around the first and second dummy pads DMP1 and DMP2 in a plan view and may physically come into contact with the first and second dummy pads DMP1 and DMP2. The dummy line GRL may be electrically connected to the ground line layer 550 of the circuit board 500 through the long side edge at the right side of the connection part 500CNA. However, the dummy line GRL is not limited thereto. For example, it may also be electrically connected to the ground line layer 550 through the long side edge at the left side of the connection part 500CNA.

The data lines DTL1 and DTL2 may come into contact with other end portions of the first and second data pads DTP1 and DTP2, respectively.

The connector 580 may overlap the dummy pads DMP1 to DMP4 in the thickness direction. As illustrated in FIG. 7, the connector 580 may completely overlap the dummy pads DMP1 to DMP4 in the thickness direction. The connector 580 may overlap one of the end portions of the data pads DTP1 and DTP2. The connector 580 may expose other end portions of the data pads DTP1 and DTP2.

The connection part 500CNA may further include a solder mask SM disposed around the plurality of pads DMP1, DMP2, DMP3, DMP4, DTP1, and DTP2. The solder mask SM may be disposed around the plurality of pads DMP1, DMP2, DMP3, DMP4, DTP1, and DTP2. The solder mask SM may partially overlap some of the pads.

Referring to FIGS. 7 and 9, the solder mask SM may partially overlap the first and second dummy pads DMP1 and DMP2 and in the same manner, partially overlap the third and fourth dummy pads DMP3 and DMP4. The solder mask SM may partially cover upper surfaces of the first and second dummy pads DMP1 and DMP2. The solder mask SM may partially expose the upper surfaces of the first and second dummy pads DMP1 and DMP2 through a first open portion OP1. That is, the upper surfaces of the first and second dummy pads DMP1 and DMP2 may be partially exposed by the solder mask SM. Hereinafter, the regions of the first and second dummy pads DMP1 and DMP2 exposed by the solder mask SM will be referred to as exposed regions ER1 and ER2, and the regions of the first and second dummy pads DMP1 and DMP2 covered by the solder mask SM will be referred to as covered regions CR1 and CR2. The exposed regions ER1 and ER2 may be surrounded by the covered regions CR1 and CR2, respectively. The exposed regions ER1 and ER2 may be disposed at central portions of the dummy pads DMP1 and DMP2 in the plan view, and the covered regions CR1 and CR2 may be disposed at edge portions of the dummy pads DMP1 and DMP2.

Further, referring to FIGS. 7 and 8, the solder mask SM may surround the first data pad arrangement in the plan view and surround the second data pad arrangement in the plan view. That is, the solder mask SM may be spaced apart from the first data pad arrangement and the second data pad arrangement with a second open portion OP2 disposed therebetween in the plan view.

The solder mask SM may overlap the dummy line GRL and the data lines DTL1 and DTL2 in the thickness direction.

As illustrated in FIG. 8, the connection part 500CNA may include a base substrate 510 and a plurality of second data pads DTP2 disposed on the first base substrate 510. The solder mask SM may be spaced apart from the second data pads DTP2 with the second open portion OP2 disposed therebetween. The plurality of second data pads DTP2 may be spaced apart from each other. The solder mask SM and the plurality of second data pads DTP2 may be disposed in the same layer.

The connector 580 may include a connector substrate 581, a connection pad CNP disposed on the connection substrate 581, and a connector solder mask CSM disposed on the connector substrate 581. The connector solder mask CSM may be spaced apart from the connection pad CNP and disposed in the same layer as the connection pad CNP. The connection pad CNP may be provided as a plurality of connection pads CNP. The plurality of connection pads CNP may be spaced apart from each other. Each connection pad CNP may correspond to each second data pad DTP2 in the thickness direction. A solder ball SB may be disposed between the connection pad CNP and the second data pad DTP2. The solder ball SB may include a conductive material. The connection pad CNP and the second data pad DTP2 may be electrically connected to each other through the solder ball SB. That is, the connection pad CNP and the second data pad DTP2 may be connected to each other.

As illustrated in FIG. 9, the connection part 500CNA may include the first base substrate 510 and the first and second dummy pads DMP1 and DMP2 disposed on the first base substrate 510. The first dummy pad DMP1 and the second dummy pad DMP2 may be spaced apart from each other. The dummy line GRL may be disposed between an inner side surface of one end portion of the first dummy pad DMP1 and an inner side surface of one end portion of the second dummy pad DMP2. The dummy line GRL may be further disposed at an outer side surface of the other end portion of the first dummy pad DMP1 and an outer side surface of the other end portion of the second dummy pad DMP2. The dummy line GRL and the first dummy pad DMP1 may be electrically connected to each other, and the dummy line GRL and the second dummy pad DMP2 may be electrically connected to each other.

The solder mask SM may be disposed on the first dummy pad DMP1, the second dummy pad DMP2, and the dummy line GRL. The solder mask SM may be disposed directly on upper surfaces of the first dummy pad DMP1, the second dummy pad DMP2, and the dummy line GRL.

The solder mask SM having a first solder mask SM1 and a second solder mask SM2 may overlap the upper surface of the dummy line GRL, overlap the one end portion (e.g., inner side portion, ISP) and the other end portion (e.g. outer side portion, OSP) of the first dummy pad DMP1, and overlap the one end portion (e.g., inner side portion, ISP) and the other end portion (e.g. outer side portion, OSP) of the second dummy pad DMP2. That is, as described above, the solder mask SM may not be disposed in the central portions (the exposed regions ER1 and ER2 of FIG. 7) of the dummy pads DMP1 and DMP2 and may be disposed in the edge portions (the covered regions CR1 and CR2 of FIG. 7) of the dummy pads DMP1 and DMP2. For example, referring to FIG. 9, the first solder mask SM1 is disposed on inner side portions ISP of the first and second dummy pads DMP1 and DMP2 and disposed between the solder balls SB. In addition, the second solder mask SM2 is further disposed on outer side portions OSP of first and second dummy pads DMP1 and DMP2, and the solder balls SB directly contact the second solder mask SM2 on the outer side portions OSP of the dummy pads DMP1 and DMP2.

As another exemplary embodiment, unlike FIG. 9, the solder mask SM may be disposed in the same layer as the first dummy pad DMP1 and the second dummy pad DMP2.

The connector 580 may include dummy connection pads DCNP1 and DCNP2 disposed on the connector substrate 581 and the connector solder mask CSM disposed on the connector substrate 581. The first dummy connection pad DCNP1 may overlap the first dummy pad DMP1 in the thickness direction and correspond thereto, and the second dummy connection pad DCNP2 may overlap the second dummy pad DMP2 in the thickness direction and correspond thereto.

Similar to the solder mask SM, the connector solder mask CSM may be disposed on the first dummy connection pad DCNP1 and the second dummy connection pad DCNP2. Referring to FIG. 9, the connector solder mask CSM may be disposed directly on lower surfaces of the first dummy connection pad DCNP1 and the second dummy connection pad DCNP2.

The connector solder mask CSM may overlap one end portion and the other end portion of the first dummy connection pad DCNP1 and overlap one end portion and the other end portion of the second dummy connection pad DCNP2. That is, the connector solder mask CSM may not be disposed at central portions of the first dummy connection pad DCNP1 and the second dummy connection pad DCNP2, but may be disposed at edge portions of the first dummy connection pad DCNP1 and the second dummy connection pad DCNP2.

The solder ball SB may be disposed between the first dummy pad DMP1 and the first dummy connection pad DCNP1 corresponding thereto and serve to electrically connect the first dummy pad DMP1 and the first dummy connection pad DCNP1 corresponding thereto and may be disposed between the second dummy pad DMP2 and the second dummy connection pad DCNP2 corresponding thereto and serve to electrically connect the second dummy pad DMP2 and the second dummy connection pad DCNP2 corresponding thereto. The solder ball SB may come into direct contact with the first dummy pad DMP1 and the first dummy connection pad DCNP1 and come into direct contact with the second dummy pad DMP2 and the second dummy connection pad DCNP2. The solder ball SB may come into contact with the solder mask SM and the connector solder mask CSM which are adjacent thereto.

According to the exemplary embodiment, since the data pads DTP1 and DTP2 are arranged at narrow pitches in the second direction (Y-axis direction), the solder mask SM may be spaced apart from the data pads DTP1 and DTP2 and adjacent thereto as illustrated in FIGS. 7 and 8 instead of being disposed to partially cover the data pads DTP1 and DTP2.

However, unlike the data pads DTP1 and DTP2, the dummy pads DMP1 and DMP2 may be arranged at relatively wide pitches in the first direction (X-axis direction). Also, unlike the data lines DTL1 and DTL2, the dummy line GRL electrically connected to the dummy pads DMP1 and DMP2 may be formed as one body and connected like the first and second dummy pads DMP1 and DMP2. When, like the data pads DTP1 and DTP2, the solder mask SM disposed adjacent to the dummy pads DMP1 and DMP2 is spaced apart from the dummy pad arrangement with an open portion disposed therebetween, the range of movement of the solder ball SB may be large. That is, since the solder ball SB may move to the open portion, tilting and shifting of the connector 580 may easily occur. Thus, damage to and a disconnection failure of the connector 580 may occur.

However, the solder mask SM of the display device according to the illustrated exemplary embodiment may overlap the one end portion (e.g., inner side portion, ISP) and the other end portion (e.g., outer side portion, OSP) of the first dummy pad DMP1 and overlap the one end portion (e.g., inner side portion, ISP) and the other end portion (e.g., outer side portion, OSP) of the second dummy pad DMP2. That is, as described above, the solder mask SM may not be disposed in the central portions (the exposed regions ER1 and ER2 of FIG. 7) of the dummy pads DMP1 and DMP2 and may be disposed in the edge portions (the covered regions CR1 and CR2 of FIG. 7) of the dummy pads DMP1 and DMP2. Thus, the solder ball SB may move within a limited separation distance LD between the solder mask SM on the dummy pad DMP1 and the solder mask SM on the dummy pad DMP2. Thus, damage to and a disconnection failure of the connector 580 due to tilting and shifting of the connector 580 may be reduced or prevented.

Figure 10:
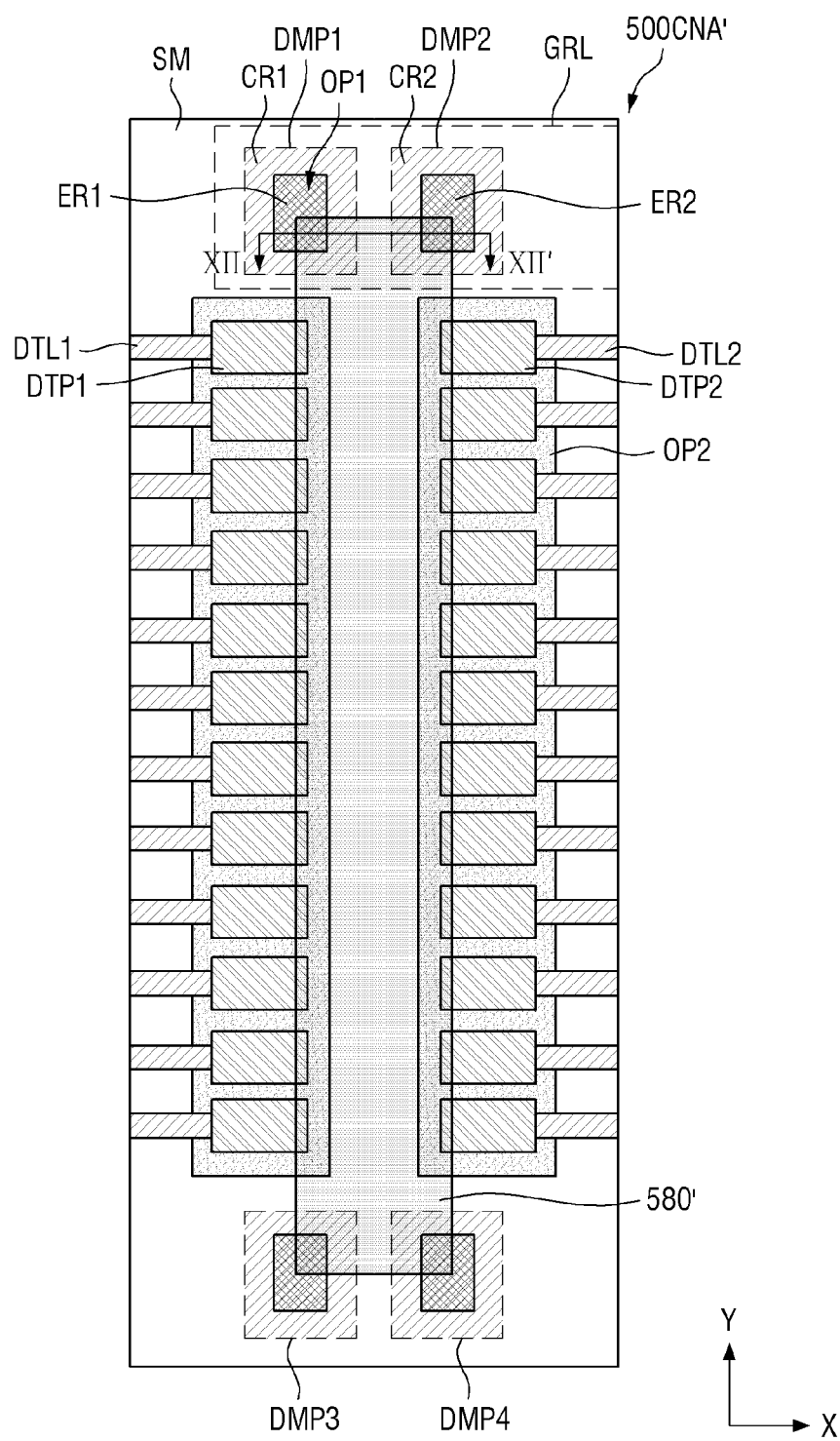
FIG. 10 is an enlarged plan view of another exemplary embodiment of a connection part and a connector of the circuit board of FIG. 5.
Figure 11:
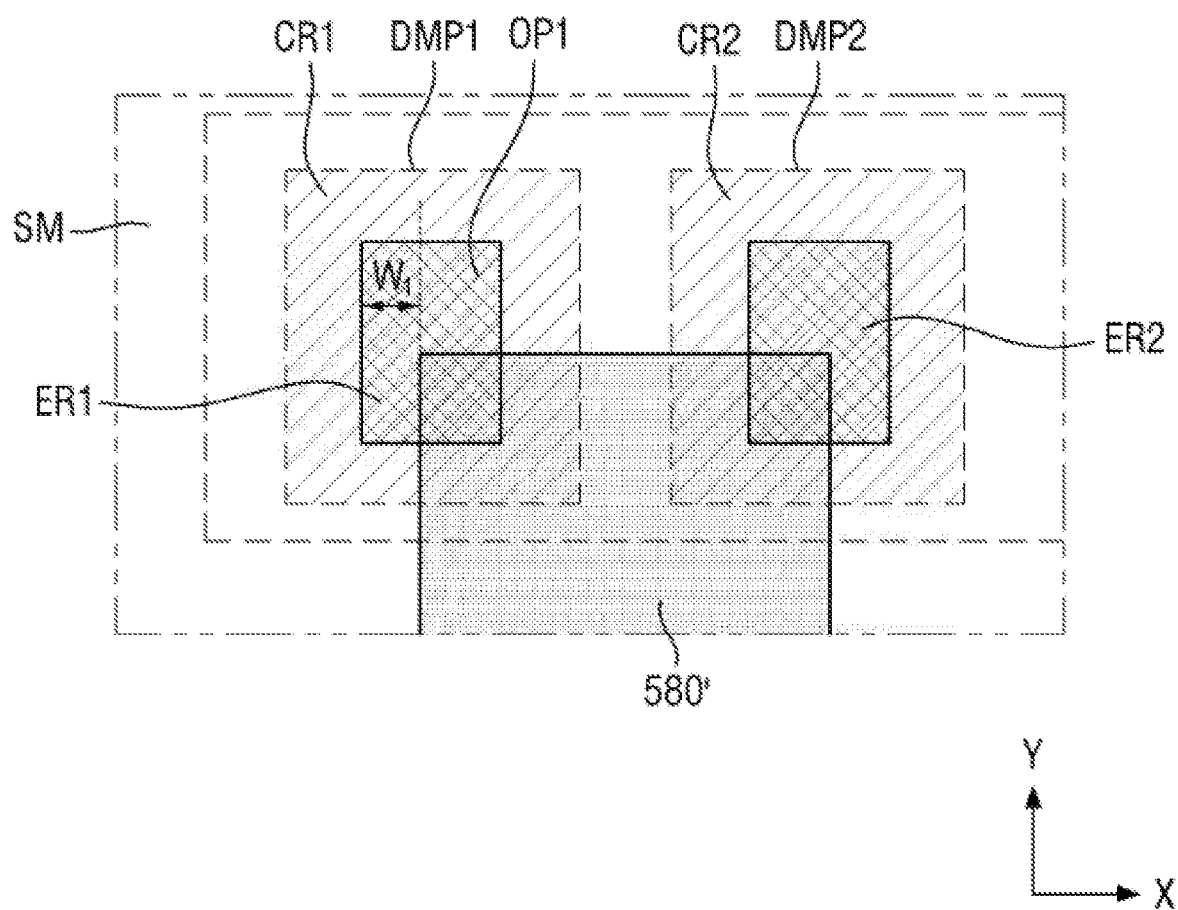
FIG. 11 is an enlarged view of an exemplary embodiment of an upper portion of FIG. 10.
Figure 12:
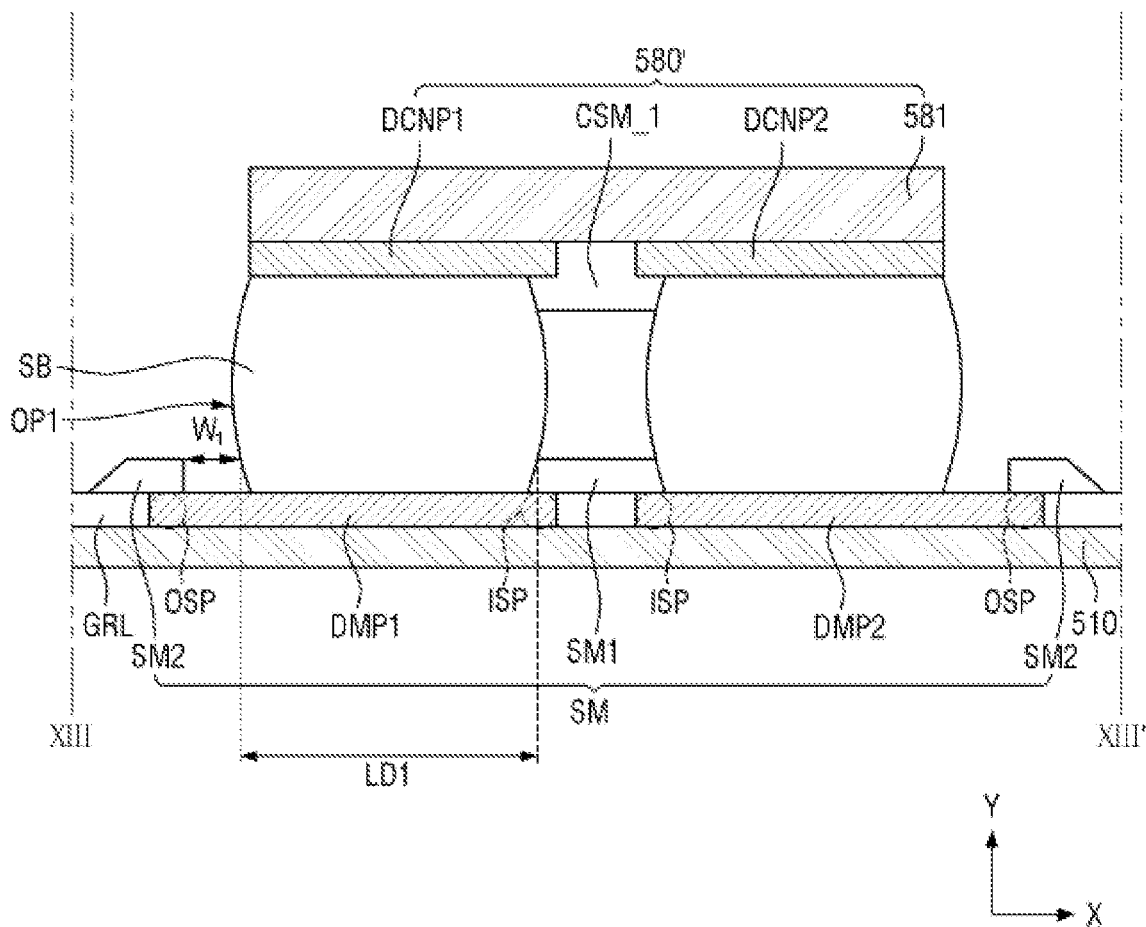
FIG. 12 is a cross-sectional view taken along line XII-XII' of FIG. 10.

FIG. 10 is an enlarged plan view of another exemplary embodiment of a connection part and a connector of the circuit board of FIG. 5, FIG. 11 is an enlarged view of an exemplary embodiment of an upper portion of FIG. 10, and FIG. 12 is a cross-sectional view taken along line XII-XII' of FIG. 10.

Referring to FIGS. 10 to 12, the display device according to the illustrated exemplary embodiments are different from the exemplary embodiment according to FIG. 7 in that the connector 580' may cover only portions of the dummy pads DMP1 to DMP4 of the connection part 500CNA' and expose the remaining portions thereof.

In more detail, the display device according to the illustrated exemplary embodiment may cover only portions of the dummy pads DMP1 to DMP4 and expose the remaining portions thereof. As illustrated in FIG. 10, the connector 580' may overlap a lower end at a right side of the first dummy pad DMP1 in the drawings and expose the remaining regions of the first dummy pad DMP1 and may overlap a lower end at a left side of the second dummy pad DMP2 in the drawings and expose the remaining regions of the second dummy pad DMP2. The connector 580' may overlap an upper end at a right side of the third dummy pad DMP3 in the drawings and expose the remaining regions of the third dummy pad DMP3 and may overlap an upper end at a left side of the fourth dummy pad DMP4 in the drawings and expose the remaining regions thereof. That is, referring to FIG. 12, the exposed region of the first dummy pad DMP1 may extend further outward than the first dummy connection pad DCNP1 corresponding thereto.

As illustrated in FIG. 11, edges not overlapping the connector 580' among edges of the connector 580' extending in the second direction (Y-axis direction) and edges of the first exposed region ER1 of the first dummy pad DMP1 extending in the second direction (Y-axis direction) may be spaced apart from each other at a first width W1.

The first width W1 may range from, for example, about 0.08 mm to about 0.12 mm. Edges not overlapping the connector 580' among the edges of the first exposed region ER1 of the first dummy pad DMP1 extending in the second direction (Y-axis direction) and edges not overlapping the connector 580' among edges of the first covered region CR1 of the first dummy pad DMP1 extending in the second direction (Y-axis direction) may be spaced apart from each other at a width of about 0.03 mm to about 0.05 mm.

Referring to FIG. 12, the solder ball SB may be spaced apart from the solder mask SM adjacent thereto by the first width W1. The solder ball SB may be moved by the first width W1 in the process of bonding the connector 580' and the first dummy pad DMP1. For example, referring to FIG. 12, the first solder mask SM1 is disposed on inner side portions ISP of the first and second dummy pads DMP1 and DMP2 and disposed between the solder balls SB. In addition, the second solder mask SM2 is further disposed on outer side portions OSP of first and second dummy pads DMP1 and DMP2, and the one solder balls SB are spaced apart from the second solder mask SM2 on the outer side portions OSP of the dummy pads DMP1 and DMP2.

As described above, according to the illustrated exemplary embodiment, since the data pads DTP1 and DTP2 are arranged at narrow pitches in the second direction (Y-axis direction), the solder mask SM may be spaced apart from the data pads DTP1 and DTP2 adjacent thereto instead of being disposed to partially cover the data pads DTP1 and DTP2.

However, unlike the data pads DTP1 and DTP2, the dummy pads DMP1 and DMP2 may be arranged at relatively wide pitches in the first direction (X-axis direction). Also, unlike the data lines DTL1 and DTL2, the dummy line GRL electrically connected to the dummy pads DMP1 and DMP2 may be formed as one body and connected like the first and second dummy pads DMP1 and DMP2. When, like the data pads DTP1 and DTP2, the solder mask SM disposed adjacent to the dummy pads DMP1 and DMP2 is spaced apart from the dummy pad arrangement with an open portion disposed therebetween, the range of movement of the solder ball SB may be large. That is, since the solder ball SB may move to the open portion, tilting and shifting of the connector 580' may easily occur. Thus, damage to and a disconnection failure of the connector 580' may occur.

However, the solder mask SM according to the illustrated exemplary embodiment may overlap the one end portion and the other end portion of the first dummy pad DMP1 and overlap the one end portion and the other end portion of the second dummy pad DMP2. That is, as described above, the solder mask SM may not be disposed in the central portions of the dummy pads DMP1 and DMP2 and may be disposed in the edge portions of the dummy pads DMP1 and DMP2. Thus, the solder ball SB may move within a limited, separation distance LD1 between the solder mask SM on the dummy pad DMP1 and the solder mask SM on the dummy pad DMP2. Thus, damage to and a disconnection failure of the connector 580' due to tilting and shifting of the connector 580' may be reduced or prevented.

Figure 13:
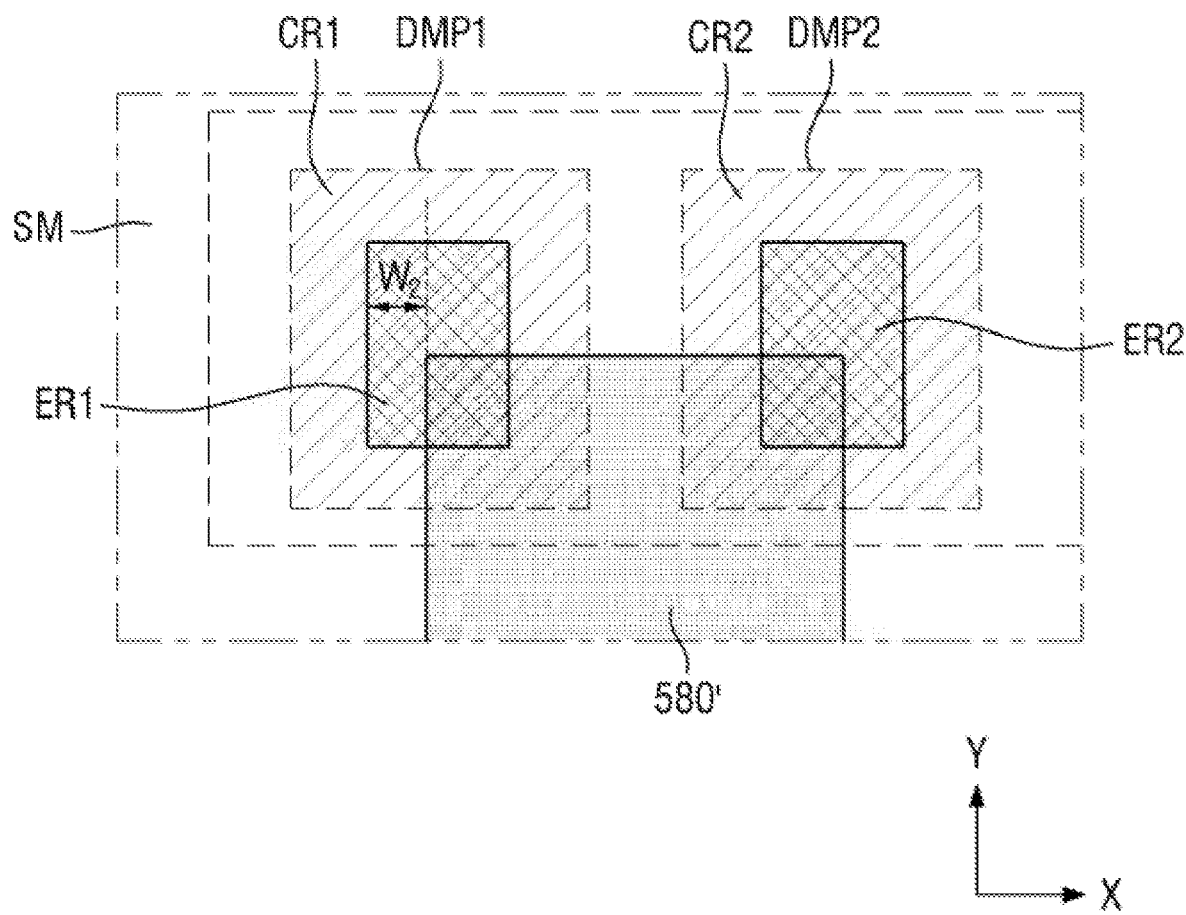
FIG. 13 is an enlarged view of another exemplary embodiment of an upper portion of FIG. 10.

FIG. 13 is an enlarged view of another exemplary embodiment of an upper portion of FIG. 10.

Referring to FIG. 13, in the display device according to the illustrated exemplary embodiment, edges not overlapping the connector 580' among edges of the connector 580' extending in the second direction (Y-axis direction) and edges of the first exposed region ER1 of the first dummy pad DMP1 extending in the second direction (Y-axis direction) may be spaced apart from each other at a second width W2.

The second width W2 may range from, for example, about 0.05 mm to about 0.07 mm. The solder ball SB may be spaced the second width W2 apart from the solder mask SM adjacent thereto. The solder ball SB may be moved by the second width W2 in the process of bonding the connector 580' and the first dummy pad DMP1. That is, the solder ball SB of the display device according to the illustrated exemplary embodiment may have a range of movement smaller than that of the exemplary embodiment according to the FIGS. 10 and 11. Thus, damage to and a disconnection failure of the connector 580 due to tilting and shifting of the connector 580 may be prevented.

Figure 14:
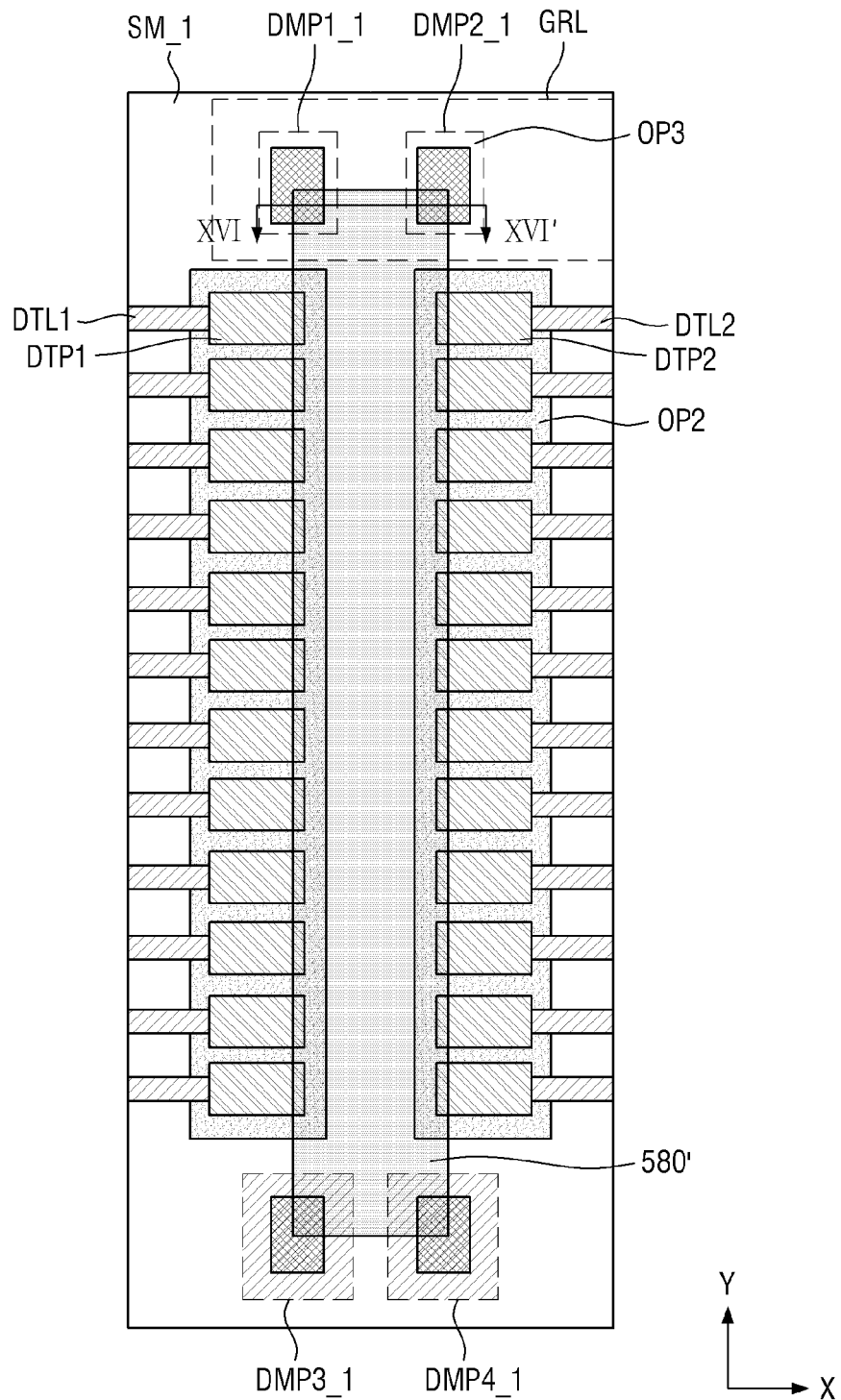
FIG. 14 is an enlarged plan view of still another exemplary embodiment of a connection part and a connector of the circuit board of FIG. 5.
Figure 15:
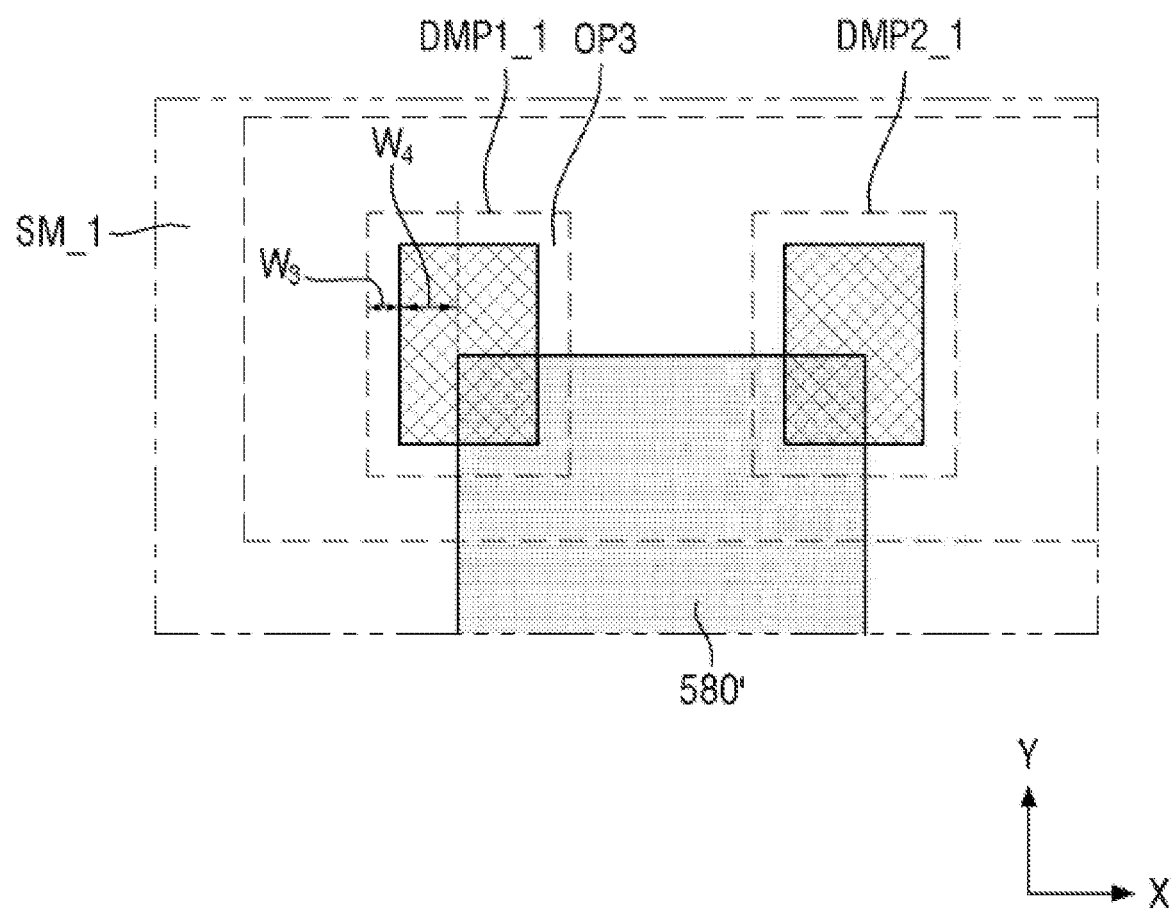
FIG. 15 is an enlarged view of an upper portion of FIG. 14.
Figure 16:
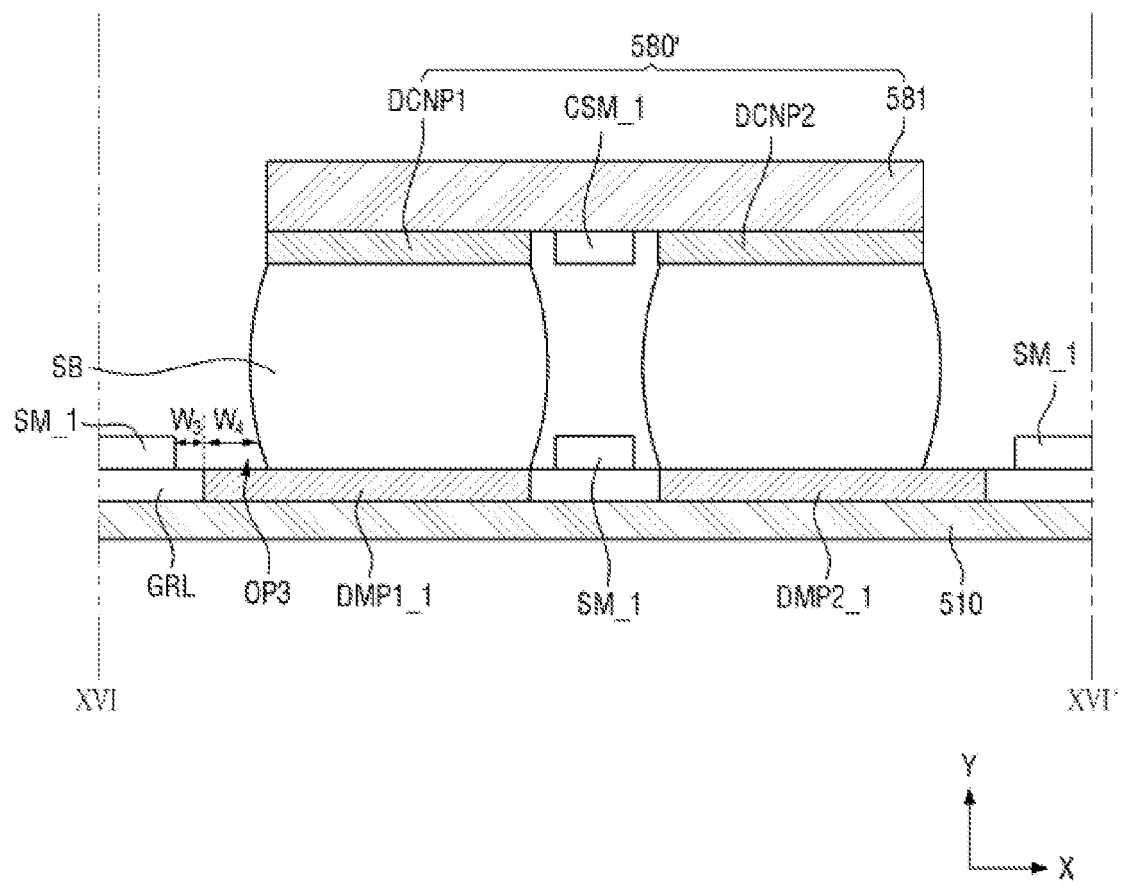
FIG. 16 is a cross-sectional view taken along line XVI-XVI' of FIG. 14.

FIG. 14 is an enlarged plan view of still another exemplary embodiment of a connection part and a connector of the circuit board of FIG. 5, FIG. 15 is an enlarged view of an upper portion of FIG. 14, and FIG. 16 is a cross-sectional view taken along line XVI-XVI' of FIG. 14.

Referring to FIGS. 14 to 16, the display device according to the illustrated exemplary embodiments are different from the exemplary embodiment according to FIG. 10 in that the dummy pads DMP1 and DMP2 and a solder mask SM_1 may be spaced apart from each other in a plan view.

In more detail, the solder mask SM_1 may be disposed so as not to overlap the dummy pads DMP1_1 and DMP2_1 in the thickness direction. That is, referring to FIGS. 15 and 16, the solder mask SM_1 disposed on the dummy line GRL between the first dummy pad DMP1_1 and the second dummy pad DMP2_1 may have a width smaller than that of the dummy line GRL overlap the central portion of the dummy line GRL, and expose portions of both sides of the dummy line GRL. The solder mask SM_1 disposed in the above-described region may be disposed so as not to overlap the first and second dummy pads DMP1_1 and DMP2_1 and expose the first and second dummy pads DMP1_1 and DMP2_1.

The solder mask SM_1 disposed on the dummy line GRL disposed at a left side and a right side of each of the first dummy pad DMP1_1 and the second dummy pad DMP2_1 in the drawings may also expose regions of the dummy lines GRL adjacent to the dummy pads DMP1_1 and DMP2_1, overlap the remaining regions of the dummy line GRL in the thickness direction, and cover the remaining regions.

That is, the solder mask SM_1 disposed on the dummy line GRL between the first dummy pad DMP1_1 and the second dummy pad DMP2_1 and the solder mask SM_1 disposed on the dummy line GRL disposed at the left side and the right side of each of the first dummy pad DMP1_1 and the second dummy pad dMP2_1 may be spaced apart from each other with a third open portion OP3 disposed therebetween.

The edge of the connector 580' extending in the second direction (Y-axis direction) and the boundary between the side surface of the other end portion of the first dummy pad DMP1 and the side surface of the dummy line GRL may be spaced apart from each other at a fourth width W4 in the plan view.

The fourth width W4 may range from, for example, about 0.05 mm to about 0.07 mm.

An inner side surface of the solder mask SM_1 disposed on the dummy line GRL disposed at a left side of each of the first dummy pad DMP1_1 and the second dummy pad DMP2_1 in the drawings and the boundary between the side surface of the other end portion of the first dummy pad DMP1_1 and the side surface of the dummy line GRL may be spaced apart from each other at a third width W3 in the plan view. For example, the third width W3 may be a distance between an outside portion of first dummy pad DMP1_1 and the first solder mask SM adjacent to the outside portion of first dummy pad DMP1_1. The third width W3 may range from, for example, about 0.05 mm.

The solder ball SB may be moved within a limited range of movement equal to the sum of the third width W3 and the fourth width W4 with respect to the left side in the drawings. That is, with respect to only the left side in the drawings, the solder ball SB may have a range of movement of about 0.1 mm to about 0.12 mm, but the exemplary embodiments are not limited thereto.

That is, the exposed region of the first dummy pad DMP1_1 may extend further outward than the first dummy connection pad DCNP1 corresponding thereto, the extending portion may have the fourth width W4, and the solder masks SM_1 adjacent to the outer side surface of the portion of the exposed region of the first dummy pad DMP1_1 extending further outward than the first dummy connection pad DCNP1 may be spaced apart from each other at the third width W3. The fourth width W4 may be about twice the third width W3. For example, the fourth width W4 of the portion of the exposed region of the dummy pad extending further outward than the dummy connection pad DNCP 1, 2 is less than twice the distance W3 between an outside portion of first dummy pad DMP1_1 and the first solder mask SM adjacent to the outside portion of first dummy pad DMP1_1.

As described above, according to the illustrated exemplary embodiment, since the data pads DTP1 and DTP2 are arranged at narrow pitches in the second direction (Y-axis direction), the solder mask SM may be spaced apart from the data pads DTP1 and DTP2 adjacent thereto instead of being disposed to partially cover the data pads DTP1 and DTP2 adjacent thereto.

However, unlike the data pads DTP1 and DTP2, the dummy pads DMP1_1 and DMP2_1 may be arranged at relatively wide pitches in the first direction (X-axis direction). Also, unlike the data lines DTL1 and DTL2, the dummy line GRL electrically connected to the dummy pads DMP1_1 and DMP2_1 may be formed as one body and connected like the first and second dummy pads DMP1_1 and DMP2_1. When, like the data pads DTP1 and DTP2, the solder mask SM_1 disposed adjacent to the dummy pads DMP1_1 and DMP2_1 is spaced apart from the dummy pad arrangement with an open portion disposed therebetween, the range of movement of the solder ball SB may be large. That is, since the solder ball SB may move to the open portion, tilting and shifting of the connector 580' may easily occur. Thus, damage to and a disconnection failure of the connector 580' may occur.

However, in the case of the display device according to the illustrated exemplary embodiment, by reducing the fourth width W4 to about 0.06 mm, the range of movement of the solder ball SB is reduced, thereby minimizing occurrence of damage to and a disconnection failure of the connector 580'.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel;
a first circuit board having a first portion connected to one portion of the display panel and comprising a connector including a base substrate, a plurality of dummy connection pads disposed on the base substrate and a second solder mask partially covering the dummy connection pads and exposing a portion of the dummy connection pads; and
a second circuit board electrically connected to the first circuit board through the connector,
wherein the first portion includes a first base substrate, a dummy pad disposed on the first base substrate, and a first solder mask partially covering the dummy pad and exposing a portion of the dummy pad, the dummy pad comprises a covered region covered by the first solder mask and an exposed region exposed by the first solder mask, and a solder ball, wherein the exposed region of the dummy pad is connected to the connector through the solder ball.

2. The display device of claim 1, wherein the dummy pad and the solder ball comprise a plurality of dummy pads and a plurality of solder balls, respectively, the plurality of dummy pads and solder balls are spaced apart from each other, respectively, and the first solder mask is disposed on end portions of the dummy pads.

3. The display device of claim 2, wherein each of the dummy connection pads overlaps one of the plurality of dummy pads, and the plurality of dummy connection pads are spaced apart from each other.

4. The display device of claim 3, wherein a portion of the dummy connection pad exposed by the second solder mask is connected to the dummy pad through one of the solder balls, the first solder mask and the second solder mask overlapping each other.

5. The display device of claim 1, wherein the first portion comprises a connection part having a data pad disposed on the first base substrate, the data pad comprising a plurality of data pads, the plurality of data pads being arranged in one direction, and the first solder mask surrounding the plurality of data pads.

6. The display device of claim 5, wherein the first solder mask and the data pad arrangement are spaced apart from each other with an open portion therebetween.

7. The display device of claim 6, wherein the connection part further comprises a dummy line surrounding and being connected to the plurality of dummy pads, and the dummy line is electrically connected to a ground line layer of the first circuit board.

8. The display device of claim 7, wherein the connection part further comprises a data line electrically connected to the data pad.

9. The display device of claim 2, wherein the first solder mask is further disposed on outer portions of the dummy pads, and the at least one of the solder balls directly contact the first solder mask on the outer portions of the dummy pads.

10. The display device of claim 1, wherein the first circuit board comprises a display circuit board having at least one component to drive the display panel, and the second circuit board comprises a main circuit having at least component to control the display device.

11. A display device comprising:

a display panel;

a first circuit board having a first portion connected to one portion of the display panel and comprising a connector; and a second circuit board electrically connected to the first circuit board through the connector, wherein the first portion includes a first base substrate, a dummy pad disposed on the first base substrate, and a first solder mask partially covering the dummy pad and exposing a portion of the dummy pad, the dummy pad comprises a covered region covered by the first solder mask and an exposed region exposed by the first solder mask, and a solder ball, wherein the exposed region of the dummy pad is connected to the connector through the solder ball, wherein the first portion further comprises a connection part having a data pad disposed on the first base substrate, the data pad comprising a plurality of data pads, the plurality of data pads being arranged in one direction, and the first solder mask surrounding the plurality of data pads, wherein the first solder mask and the data pad arrangement are spaced apart from each other with an open portion therebetween, wherein the connection part further comprises a dummy line surrounding and being connected to the plurality of dummy pads, and the dummy line is electrically connected to a ground line layer of the first circuit board, and wherein the dummy line and the dummy pad are disposed in the same layer.

12. A display device comprising:

a display panel;

a first circuit board having a first portion connected to one portion of the display panel and comprising a connector; and a second circuit board electrically connected to the first circuit board through the connector, wherein the first portion includes a first base substrate, a dummy pad disposed on the first base substrate, and a first solder mask partially covering the dummy pad and exposing a portion of the dummy pad, the dummy pad comprises a covered region covered by the first solder mask and an exposed region exposed by the first solder mask, and a solder ball, wherein the exposed region of the dummy pad is connected to the connector through the solder ball, wherein the first portion further comprises a connection part having a data pad disposed on the first base substrate, the data pad comprising a plurality of data pads, the plurality of data pads being arranged in one direction, and the first solder mask surrounding the plurality of data pads, wherein the first solder mask and the data pad arrangement are spaced apart from each other with an open portion therebetween, wherein the connection part further comprises a dummy line surrounding and being connected to the plurality of dummy pads, and the dummy line is electrically connected to a ground line layer of the first circuit board, and wherein the dummy line overlaps the first solder mask.

13. The display device of claim 12, wherein the dummy line directly contacts the first solder mask.

14. A display device comprising:

a display panel;

a first circuit board having a first portion connected to one portion of the display panel and comprising a connector; and a second circuit board electrically connected to the first circuit board through the connector, wherein the first portion includes a first base substrate, a dummy pad disposed on the first base substrate, and a first solder mask partially covering the dummy pad and exposing a portion of the dummy pad, the dummy pad comprises a covered region covered by the first solder mask and an exposed region exposed by the first solder mask, and a solder ball, wherein the exposed region of the dummy pad is connected to the connector through the solder ball, wherein the dummy pad and the solder ball comprise a plurality of dummy pads and a plurality of solder balls, respectively, the plurality of dummy pads and solder balls are spaced apart from each other, respectively, and the first solder mask is disposed on end portions of the dummy pads, and wherein the first solder mask is further disposed on outer portions of the dummy pads, at least one of the solder balls is spaced apart from the first solder mask on the outer portions of the dummy pads, by a separation distance of about 0.06 mm or less.

15. A display device comprising:

a display panel;

a first circuit board having a first portion connected to one portion of the display panel and comprising a connector; and a second circuit board electrically connected to the first circuit board through the connector, wherein the first portion includes a first base substrate, a dummy pad disposed on the first base substrate, and a first solder mask completely exposing the dummy pad, an exposed region of the dummy pad is connected to the connector through a solder ball, the connector comprises a base substrate and a dummy connection pad disposed on the base substrate and overlapping the dummy pad, the exposed region of the dummy pad extending further outwardly than the dummy connection pad, and a portion of the exposed region of the dummy pad extending further outwardly than the dummy connection pad by a first distance in a plan view, an outer portion of the dummy pad being spaced from the first solder mask adjacent to the outer portion of the dummy pad by a second distance in the plan view, the first distance being less than twice the second distance.

16. The display device of claim 15, wherein the first distance is about 0.06 mm or less.

17. The display device of claim 15, wherein the dummy pad and the solder ball comprise a plurality of dummy pads and a plurality of solder balls, respectively, the plurality of dummy pads and solder balls are spaced apart from each other, respectively, and the first solder mask is further disposed on end portions of the dummy pads.

18. The display device of claim 17, wherein the connector further includes a second solder mask exposing the dummy connection pad, and the dummy connection pad is connected to the dummy pad through the solder ball, the first solder mask and the second solder mask overlapping each other.

19. The display device of claim 15, wherein the first portion comprises a connection part having a dummy line surrounding the plurality of dummy pads and being connected to the plurality of dummy pads, and the dummy line is electrically connected to a ground line layer of the first circuit board.

20. The display device of claim 15, wherein the first circuit board comprises a display circuit board having at least one component to drive the display panel, and the second circuit board comprises a main circuit having at least component to control the display device.

* * * * *